(12) United States Patent
Kim

(10) Patent No.: US 7,848,131 B2
(45) Date of Patent: Dec. 7, 2010

(54) HIGH SPEED FERROELECTRIC RANDOM ACCESS MEMORY

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 291 days.

(21) Appl. No.: 12/253,997

(22) Filed: Oct. 19, 2008

(65) Prior Publication Data

US 2010/0097839 A1   Apr. 22, 2010

(51) Int. Cl.
*G11C 11/22* (2006.01)
(52) U.S. Cl. .................... 365/145; 365/189.15
(58) Field of Classification Search ............... 365/145, 365/189.15, 189.16, 189.09, 203, 205, 185.13, 365/189.14
See application file for complete search history.

(56) References Cited

U.S. PATENT DOCUMENTS

| | | | |
|---|---|---|---|
| 5,570,319 A * | 10/1996 | Santoro et al. ......... | 365/230.03 |
| 6,061,266 A | 5/2000 | Tan | |
| 6,574,135 B1 | 6/2003 | Komatsuzaki | |
| 6,819,584 B2 | 11/2004 | Noh | |
| 7,088,605 B2 | 8/2006 | Lin | |
| 7,158,428 B2 * | 1/2007 | Fujimoto ..................... | 365/203 |
| 7,251,184 B2 * | 7/2007 | Nakaya et al. ......... | 365/230.03 |
| 7,277,339 B2 * | 10/2007 | Edahiro ..................... | 365/203 |
| 7,382,641 B2 | 6/2008 | Kang et al. | |
| 7,411,810 B2 * | 8/2008 | Kim ........................... | 365/145 |
| 2008/0025113 A1 * | 1/2008 | Kitagawa ............... | 365/189.09 |
| 2008/0316839 A1 * | 12/2008 | Kajigaya ............... | 365/189.11 |

* cited by examiner

*Primary Examiner*—VanThu Nguyen
*Assistant Examiner*—Douglas King

(57) ABSTRACT

For realizing high speed ferroelectric random access memory, bit line is multi-divided for reducing parasitic capacitance, so that the bit line is quickly charged or discharged by a memory cell including a ferroelectric capacitor when reading. Particularly, a non-inverting local sense amp is devised for reducing area, such that the memory cell is read by the local sense amp through a lightly loaded local bit line, and the local sense amp is read by a global sense amp through a global bit line. By the sense amps, a voltage difference in the local bit line is converted to a time difference for differentiating data "1" and data "0", and buffered data path is used for achieving fast data transfer. Additionally, various alternative circuits and memory cell structures for implanting the memory are described.

20 Claims, 12 Drawing Sheets

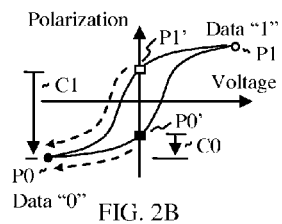
FIG. 2B
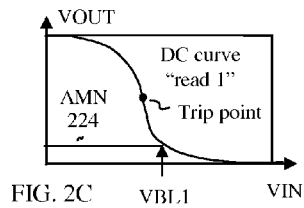
FIG. 2C
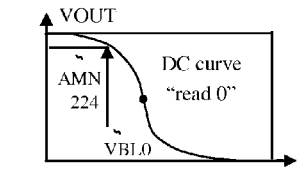
FIG. 2D
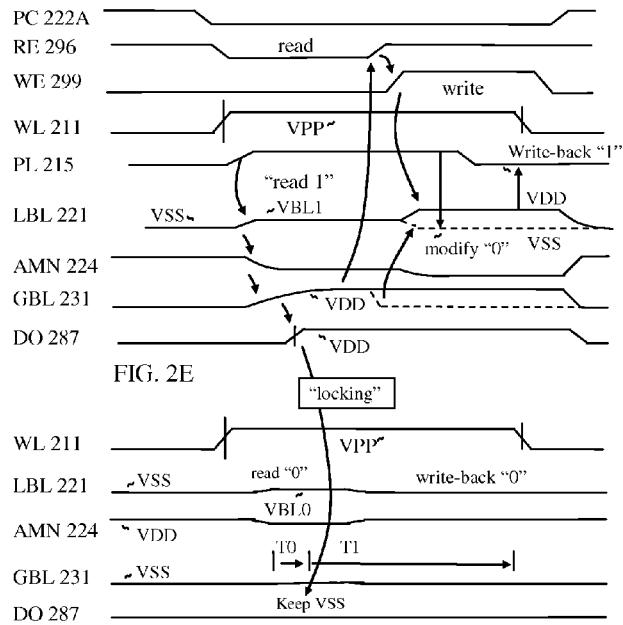
FIG. 2E
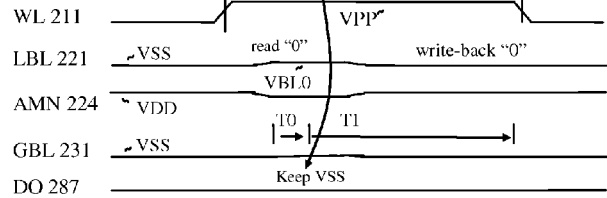
FIG. 2F
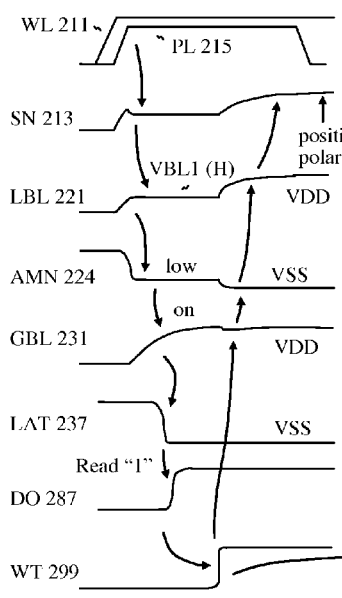
FIG. 2G
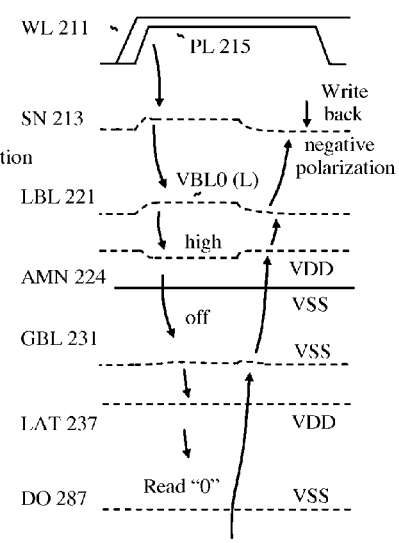
FIG. 2H
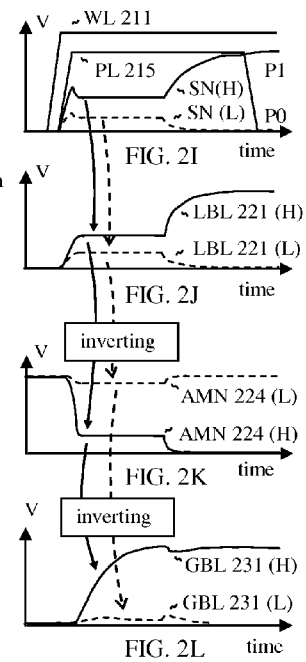
FIG. 2I
FIG. 2J
FIG. 2K
FIG. 2L

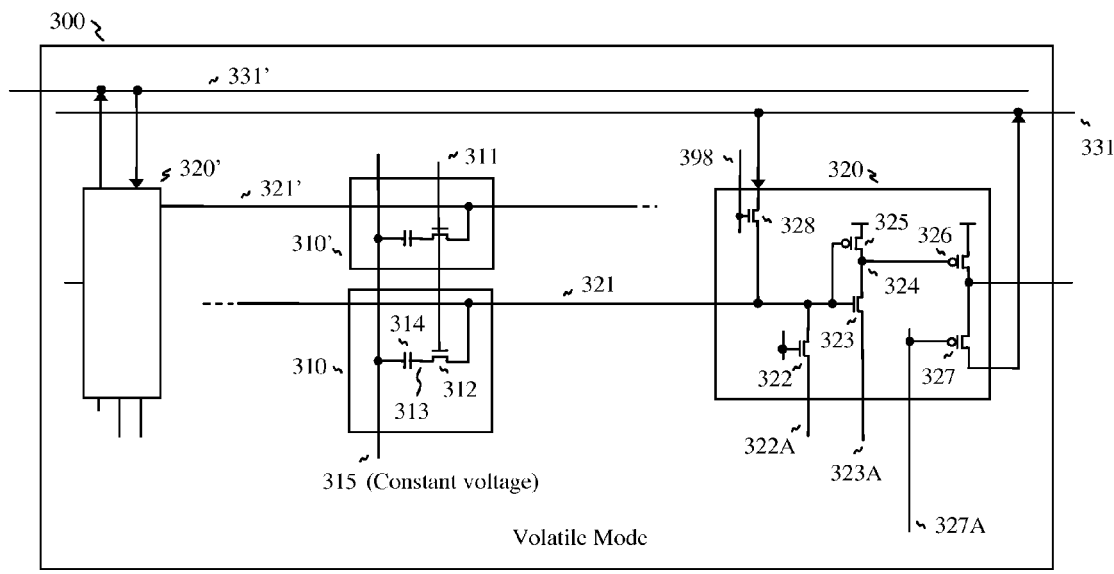
FIG. 3A
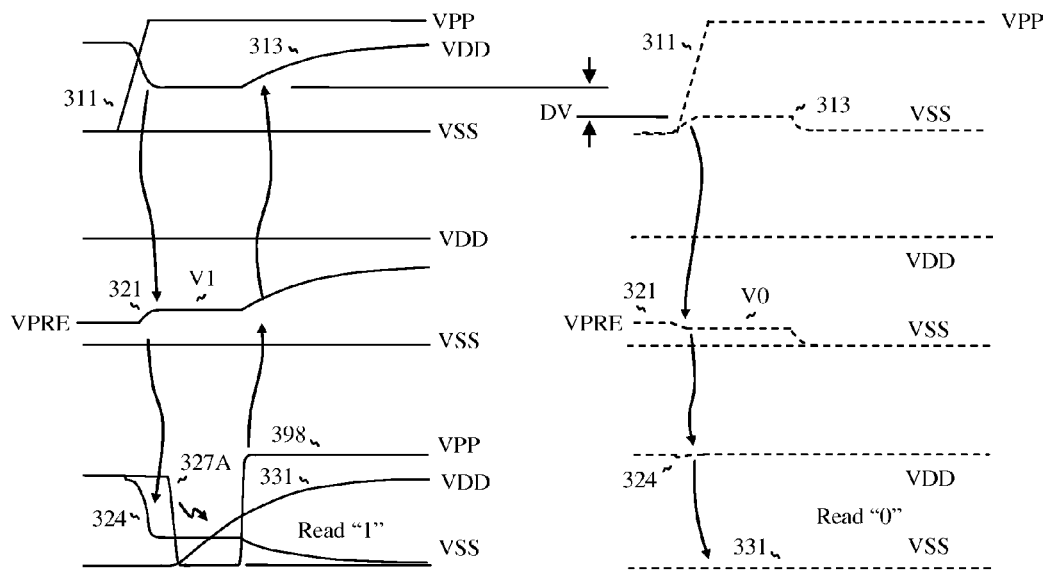
FIG. 3B                                FIG. 3C

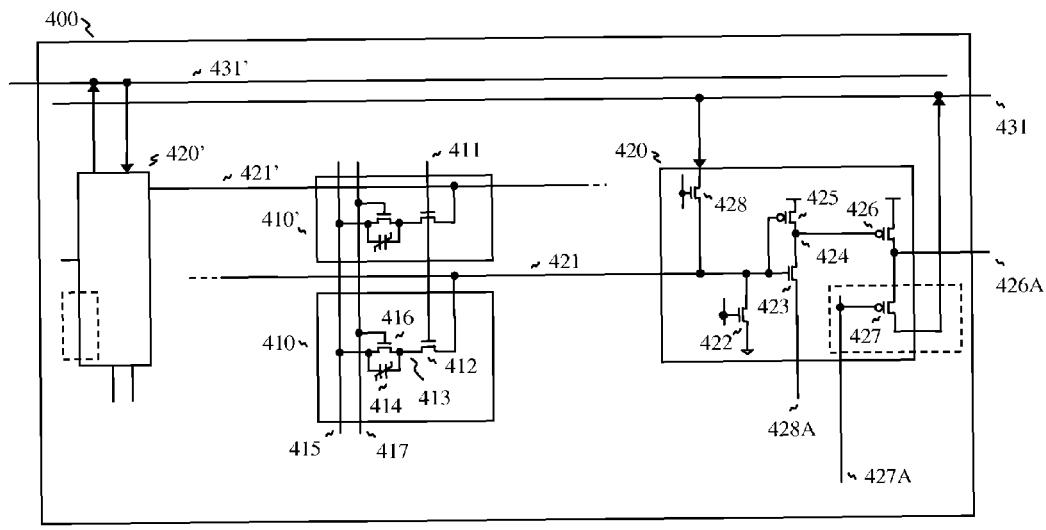
FIG. 4A
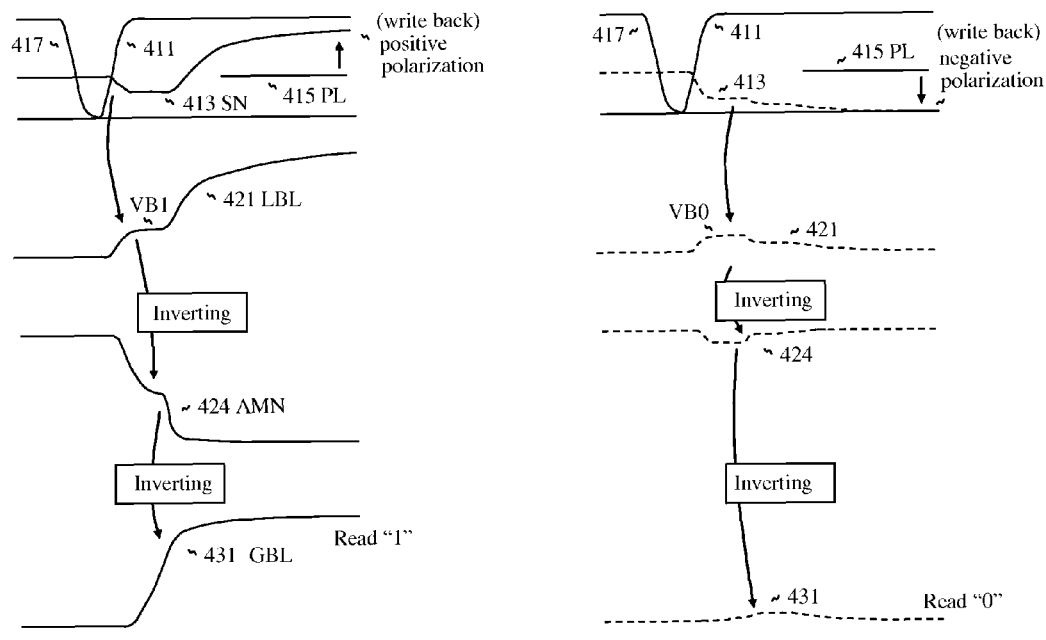
FIG. 4B
FIG. 4C

1T1C cell

FIG. 7A (6F² Cell)

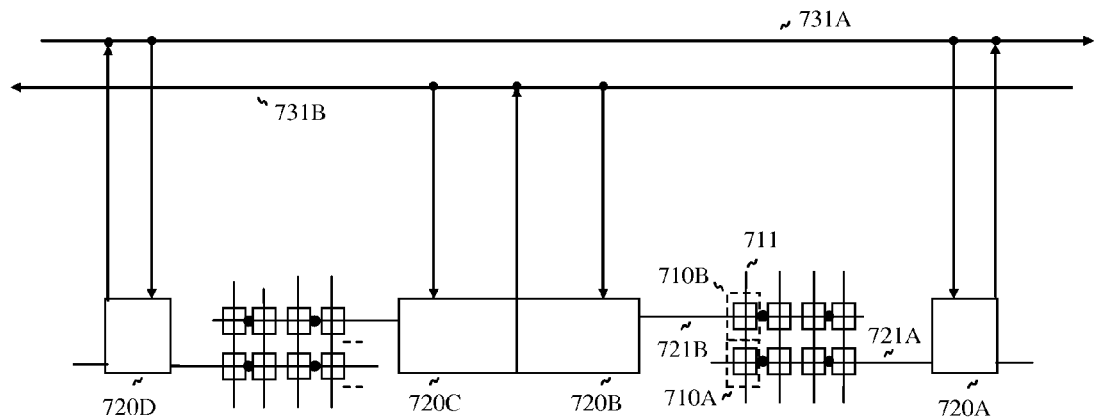
FIG. 7E
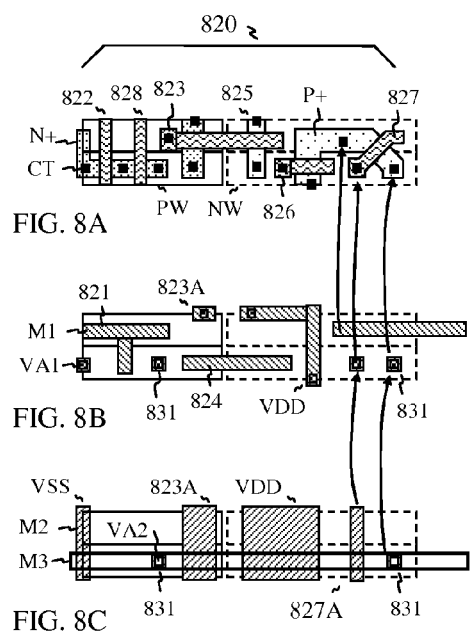
FIG. 8A
FIG. 8B
FIG. 8C
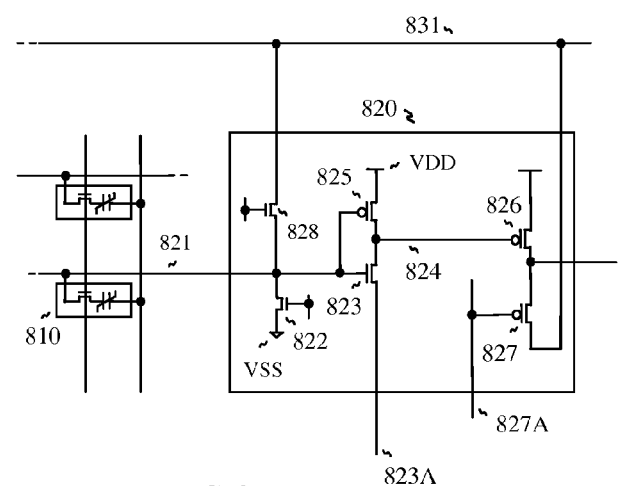
FIG. 8D

2T1C cell (8F²Cell)

FIG. 11A (4F² Cell)

HIGH SPEED FERROELECTRIC RANDOM ACCESS MEMORY

FIELD OF THE INVENTION

The present invention relates generally to integrated circuits, in particular to high speed FRAM (Ferroelectric Random Access Memory).

BACKGROUND OF THE INVENTION

FRAM (Ferroelectric Random Access Memory) is a type of non-volatile memory device that uses such a ferroelectric capacitor and preserves stored information even when the power is off. Additionally, the FRAM has high-speed access, less power consumption, and excellent shock-resistance. Accordingly, the FRAM would be expected to be used as a main storage device for various electronic devices and equipment having file storing and retrieving functions, such as computers, networks and mobile devices.

In the FRAM, a memory cell is composed of the ferroelectric capacitor and a pass transistor, and which stores logical data "1" or "0" depending on polarization state of the ferroelectric capacitor. When a voltage is applied across the ferroelectric capacitor, a ferroelectric material is polarized according to the direction of an electric field. Hence, a threshold voltage at which a change in the polarization state of the ferroelectric material occurs is called a "coercive voltage". In reading data stored in the memory cell, a voltage is applied between both electrodes of the ferroelectric capacitor to cause a potential difference, and accordingly excite charges on a bit line. The state of the data stored in the memory cell is sensed as a change in an amount of the charges excited on the bit line.

In FIG. 1, a circuit of the ferroelectric random access memory is illustrated, as a prior art, "A 0.25-um 3.0-V 1T1C 32-Mb Nonvolatile Ferroelectric RAM with Address Transition Detector and Current Forcing Sense Amplifier Scheme", IEEE Journal of Solid-State Circuits, Vol. 37, No. 11, November 2002, wherein a word line 111 is connected to memory cells 150 and 151, next word line 112 is connected to memory cells 152 and 153, and last word line 113 is connected to memory cells 154 and 155. The memory cell 150 is composed of the pass transistor 156 and the ferroelectric capacitor 157. And plate lines 121 and 122 are connected to the capacitor of the memory cells. As shown in the figure, a plurality of memory cells is connected to single bit line for integrating more memory cells on a chip, so that the bit line is long and heavily loaded. With heavily loaded bit line, capacitance value of the ferroelectric capacitor should be big enough to drive the bit line for reading. And access time is slow because there is a waiting time before the bit line is redistributed by the charges of the ferroelectric capacitor.

In order to improve access time, hierarchical bit line architecture is applied, as published, U.S. Pat. No. 7,304,881. However, differential amplifier is still used for sensing the stored data. As a result, the area is additionally increased, because the differential amplifier occupies relatively big space. Furthermore, the differential amplifier requires a reference voltage for comparing a voltage difference, which is one of difficult circuit with voltage and temperature variations, so that two memory cells store a data where one memory cell store positive data and another memory cell stores negative data for generating an inverted voltage reference. And other prior art is published, as U.S. Pat. No. 6,574,135 such that bit lines are multi-divided into short lines for sharing a sense amplifier and a data buffer through the switch. However, bit line loading is still heavy, because the local bit line is connected to the global line through a transfer transistor when reading, which increases the effective capacitance of the local bit line. And one more prior art is published as U.S. Pat. No. 6,829,154 for dividing bit line into short lines, wherein an inverting type local sense amp (including an NMOS transistor for regulating current and a main bitline load controller) is used for reading a memory cell, and an amplification unit is connected to the inverting type local sense amp, but the inverting type local sense amp needs more current to write back the read data because the main bitline is always inverted for the write back operation. Moreover, amplification unit (global sense amp) is relatively big for drawing a pitched layout with the memory cells.

In this respect, there is still a need for improving the FRAM, in order to achieve fast access and reduce area. In the present invention, light bit line architecture is applied by dividing long bit line into short bit line for reducing parasitic capacitance, and a non-inverting local sense amp is used for reading the divided bit lines, which reduces current consumption during write back operation. And a time domain sensing scheme is applied for comparing the output from the memory cell, where a reference signal is generated by a locking signal generator based on reference memory cells in order to compare data "1" and data "0", because one of data from the memory cell (data "1") is reached to a global sense amp through local sense amp with high gain while another data (data "0") is rejected by the reference signal based on data "1". With light bit line architecture, the local bit line is quickly charged of discharged when accessed, so that high speed operation is realized. And, a buffered data path is used for fast data transfer during write and read operation.

Furthermore, the FRAM can replace the conventional DRAM without refresh operation. And also the FRAM can replace the conventional SRAM with fixed plate line configuration for enhancing the speed as an alternative configuration, while the conventional FRAM is so slow for measuring the memory cell with changing the heavily loaded plate line. In the present invention, the plate line is constant for the polarization at half supply voltage for implementing the SRAM which serves as a nonvolatile SRAM with ferroelectric capacitor.

The memory cell can be formed on the surface of the wafer. And the steps in the process flow should be compatible within the current CMOS manufacturing environment. Alternatively, the memory cell can be formed from thin film polysilicon layer, because the lightly loaded bit line can be quickly charged or discharged by the memory cell even though the thin film pass transistor can flow relatively low current. In doing so, multi-stacked memory is realized with thin film transistor, which can increase the density within the conventional CMOS process.

SUMMARY OF THE INVENTION

In order to realize high speed ferroelectric random access memory (FRAM), bit line is multi-divided for reducing parasitic capacitance of the bit line, so that the bit line is quickly charged or discharged by a memory cell including a storage capacitor and a pass transistor when reading. And multi-stage sense amps are used, such that the memory cell is read by a non-inverting local sense amp through a lightly loaded local bit line, and the local sense amp is read by a global sense amp through a global bit line. By the sense amps, a voltage difference in the local bit line is converted to a time difference for differentiating data "1" having high capacitance and data "0" having low capacitance in a ferroelectric capacitor of the memory cell. For example, data "1" in the memory cell is quickly transferred to the global sense amp through the local sense amp with high gain, but data "0" is rejected to be transferred by a locking signal based on data "1" as a reference signal.

In this manner, a time domain sensing scheme is realized to differentiate data "1" and data "0". More specifically, the reference signal is generated by one of fast changing data with high gain from reference cells, which signal serves as a reference signal to generate a locking signal in order to reject latching another data which is slowly changed with low gain, such that high capacitance data is arrived first while low capacitance data is arrived later, or low capacitance data is arrived first while high capacitance data is arrived later depending on configuration. The time domain sensing scheme effectively differentiates high capacitance data and low capacitance data with time delay control, while the conventional sensing scheme is current-domain or voltage-domain sensing scheme. In the convention memory, the selected memory cell charges or discharges the bit line, and the charged or discharged voltage of the bit line is compared by a comparator which determines an output at a time. On the contrary, in the present invention, there are many advantages to read the memory cell with time domain sensing, so that the sensing time is easily controlled by a tunable delay circuit, which compensates cell-to-cell variation and wafer-to-wafer variation, thus there is a need for adding a delay time before locking with a statistical data for all the memory cells, such as mean time between fast data and slow data. Thereby the tunable delay circuit generates a delay time for optimum range. And the read output from the memory cell is transferred to the output latch circuit through the returning read path, thus the access time is equal regardless of the location of the selected memory cell, which is advantageous to transfer the read output to the external pad at a time. And the reference signal is used for enabling the write transistor for writing back the read data or overwriting a write data, which realizes fast cycle operation.

And, configuring memory is more flexible, such that multiple memory macros can be configured with small segmented memory array and multi-stage sense amps, instead of big macro with the conventional sense amps which includes differential amps. In the present invention, number of sense amps can be determined by the target speed. For example, high speed application needs more segmented array with more sense amps, while high density application needs more memory cells with reduced number of sense amps, thus cell efficiency is increased.

And, amplifying transistors of the sense amps are composed of relatively long channel transistors than those of pre-charge transistor and reset transistor, in order to reduce turn-off current, which reduces power consumption.

And, the local sense amp has high gain with wider channel MOS transistor than that of the memory cell. Hence, the stored data in the memory cell is quickly transferred to a latch of the global sense amp. After then, the data transfer circuit transfers a read output to data output node through buffers, which realizes fast read operation with no extra waiting time.

A buffered data path is connected to the global sense amp for writing and reading a data, wherein a forwarding write line serving as a forwarding write path is used for writing, such that the forwarding write path is selected by block select signals, which realizes to reduce driving current and RC time constant, because unselected portion of the data line is not charging or discharging when writing. Furthermore, unselected portion of the data line is used as a returning read path. Thus, the returning read path receives a read output from the memory cell through multi-stage sense amps. And the returning read path is also buffered and connected to data output node through multiple buffers. With the returning read path, access time is almost same regardless of selected memory cell location, which realizes to latch the read output at a time with enough set-up and hold time even though a latch clock is fixed.

Many alternative configurations are described, such that the ferroelectric capacitor can be used as a volatile memory when a plate line is forced to a constant voltage for eliminating fatigue of the ferroelectric capacitor as an alternative configuration, which can replace the conventional DRAM. For obtaining long retention time for the volatile memory with the constant plate line, the local bit line is pre-charged to a pre-determined voltage which is higher than ground voltage, so that sub-threshold leakage current is dramatically reduced during standby, because a word line is forced to ground voltage, which realizes a negative word line scheme without using any extra negative voltage source. More specifically, the source of the pass transistor connecting to the bit line is forced to higher than ground voltage, the word line is forced to ground voltage, and the stored charge is near supply voltage when storing data "1". Thus, the word line voltage is lower than the voltage of the source (bit line) and the drain (storage node). In contrast, data "0" can be lost easily, but the time domain sensing scheme does not read data "0" because the locking signal rejects data "0" to be latched as explained above. Furthermore, with this sensing scheme, regular capacitor can be used for configuring the volatile memory, with regular dielectric capacitor.

And, two transistor and one ferroelectric capacitor (2T1C) memory is realized for replacing the conventional SRAM as an alternative configuration. The 2T1C memory cell operates nonvolatile mode as well, which is very useful for replacing the conventional SRAM cache memory with reduced area. Another useful alternative configuration is a series FRAM, which can replace the conventional flash memory.

And, a reduced memory cell can be read by the sensing scheme, such that the lightly loaded bit line can be charged or discharged the reduced capacitor as a storage element, which realizes to miniaturize the memory cell further. Moreover, the present invention realizes multi-stacked memory cell structure including thin film transistor because the memory cell only drives lightly loaded bit line even though thin film polysilicon transistor can flow lower current than that of the conventional single crystal silicon transistor, such as, 10-20 times lower, for example.

And, a fingered shape capacitor is used as a storage capacitor for increasing storage capacitance in a given area, which realizes very high density memory, wherein the fingered shape capacitor is composed of a first fingered shape plate and a second fingered shape plate. And also multiple fingered shape capacitors can be formed in between metal routing layers for eliminating deep contact, where each capacitor is connected through relatively shallow contact.

And, example memory cell layout and cross sectional views are illustrated to minimize cell area. And the fabrication method is compatible with the conventional CMOS process including single-crystal-based regular transistor. And alternatively, additional steps are required for using thin film transistor as a pass transistor of the memory cell. And the memory cell can be formed from various semiconductor materials, such as silicon-germanium and germanium.

Furthermore, various ferroelectric capacitors can be used as a nonvolatile storage element, such as lead zirconate titanate (PZT), lead lanthanum zirconium titanate (PLZT), barium strontium titanate (BST), and strontium bismuth tantalate (SBT). And, various regular dielectric materials can be used for forming the regular capacitor as a volatile storage element. For example, volatile memory uses ordinary dielectric material, such as silicon dioxide, silicon nitride, Ta2O5, TiO2, Al2O3, TiN/HfO2/TiN(TIT), and Ru/Insulator/TiN(RIT). And PIP (Polysilicon Insulator Polysilicon) capacitor structure and MIM (Metal Insulator Metal) capacitor structure can be used for forming the capacitor.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIG. 2B illustrates hysteresis curve of the ferroelectric capacitor, FIG. 2C illustrates an I-V curve of the inverter of the local sense amp when reading data "1", FIG. 2D illustrates an I-V curve of the inverter of the local sense amp when reading data "0", FIG. 2E illustrates timing waveform for reading data "1", FIG. 2F illustrates timing waveform for reading data "0", and FIGS. 2G, 2H, 2I, 2J, 2K and 2L illustrate simulated waveforms with SPICE simulator, according to the teachings of the present invention.

FIG. 3A illustrates an alternative memory segment operating with 1T1C memory cell as a volatile memory, FIG. 3B illustrates simulated waveform when reading data "1", FIG. 3C illustrates simulated waveform when reading data "0" for the alternative memory segment, according to the teachings of the present invention.

FIG. 4A illustrates an alternative memory segment for configuring 2T1C memory cell, FIG. 4B illustrates simulated waveform when reading data "1", FIG. 4C illustrates simulated waveform when reading data "0" for the alternative memory segment.

FIGS. 7A, 7B, 7C and 7D illustrate an example memory cell layout for the memory cell (as shown 210 in FIG. 2A), and FIG. 7E illustrates a block diagram for implementing the open bit line architecture, according to the teachings of the present invention.

FIGS. 8A, 8B and 8C illustrate an example layout for the local sense amp, and FIG. 8D illustrates the related local sense amp circuit for explaining the layout, according to the teachings of the present invention.

FIG. 11A illustrates an example cross sectional view of the series memory cells.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
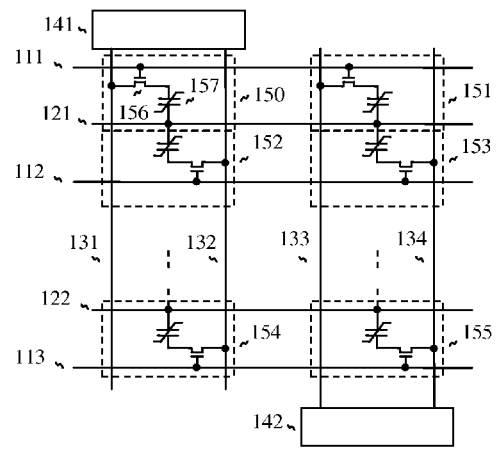
FIG. 1 illustrates a ferroelectric random access memory, as a prior art.
Figure 2A:
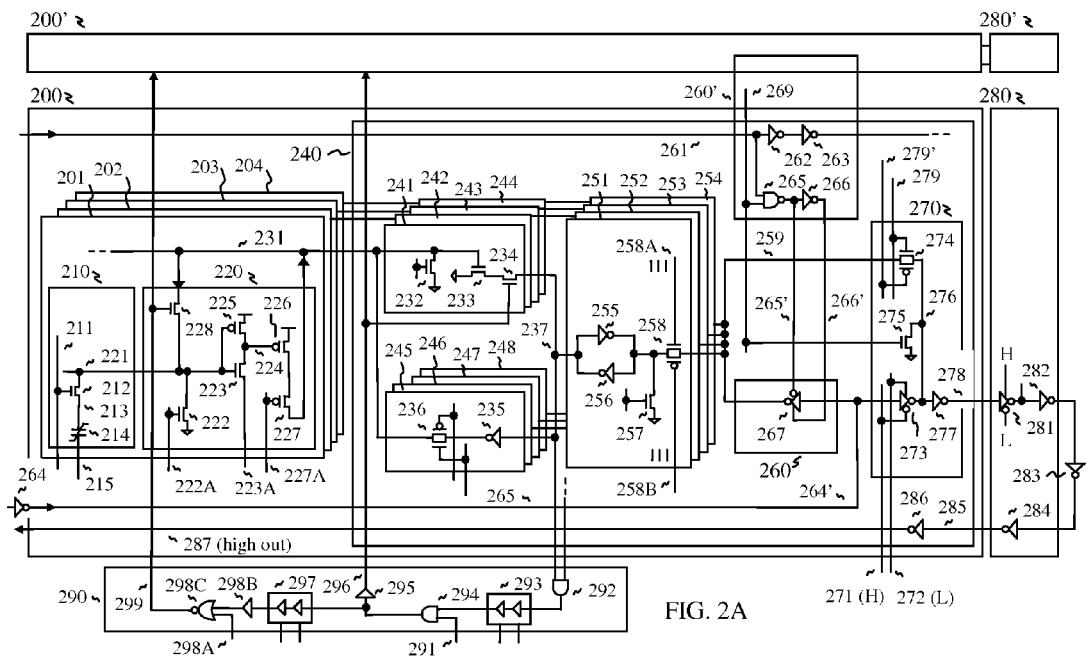
FIG. 2A illustrates high speed nonvolatile FRAM with 1T1C memory cell as the present invention.

The present invention is directed to high speed ferroelectric random access memory as shown in FIG. 2A, wherein a memory block 200 comprises memory segments 201, 202, 203 and 204, and a global sense amp 240. The memory segment 201 includes a memory cell 210 and a non-inverting local sense amp 220, wherein the memory cell 210 is composed of 1 transistor and 1 capacitor (1T1C) including a pass transistor 212 and a ferroelectric capacitor 214 which is connected to a plate line 215.

For reading and writing the memory cell 210, the pass transistor 212 is connected to a word line 211, and the (non-inverting) local sense amp 220 is connected to the memory cell 210 through a local bit line 221. By raising the word line 211 and the plate line 215, the local bit line 221 is raised from a pre-charged voltage by coupling of the capacitor 214 of the memory cell. The local bit line voltage is determined by the value of the capacitor 214. For example, high value of the storage capacitor pulls up the local bit line higher, while low value of the storage capacitor pulls up the local bit line lower. Hence, the voltage difference of the local bit line is read by the local sense amp 220, and the output is transferred to the global sense amp through a global bit line 231. And the global sense amp 240 is also connected to next memory block 280.

And, a buffered data path is connected to the global sense amp 240, such that the buffered data path includes a forwarding write path and a returning read path, which realizes to improve performance, because data line is divided into short lines for fast transferring data while unselected portion of the data line is not discharging for reducing discharging current when writing. Hence, a forwarding write line 264' serves as a write path, such that the forwarding write line 264' receives an inverting write data from a write inverter 264 and a data receive circuit 260 is enabled by write enable signals 265' and 266' for receiving write data from the forwarding write line 264'. When reading, unselected portion of the data line is used as a read data line which is a forwarding read line 278. Thus, the forwarding read line 278 receives a read output from a memory cell through multi-stage sense amps. And the forwarding read line is buffered by multiple buffers including returning buffers 284 and 286 through a returning read line 285. With the returning read path, access time is almost same regardless of selected memory cell location, which realizes to latch the read output at a time with enough set-up and hold time even though a latch clock is fixed. More detailed read operation and write operation will be explained as below.

For realizing fast random access, the non-inverting local sense amp 220 detects the memory cell 210 through lightly loaded local bit line 221, wherein the non-inverting local sense amp 220 is composed of a first inverting amplifier which inverts phase, and a second inverting amplifier which recovers the phase, wherein the first inverting amplifier reading voltage output of the local bit line 221 includes a local pre-charge transistor 222, a write transistor 228 and the first inverting amplifier which is composed of an inverter including an NMOS 223 as a first amplify transistor and a PMOS 225 as a pull-up transistor. The inverter output is connected to an amplifying node 224. And the second inverting amplifier reading voltage of the amplifying node 224 includes a second amplify transistor 226 and a local select transistor 227 which is connected to the global bit line 231.

More specifically, the global sense amp 240 includes four bit read circuits 241, 242, 243 and 244 for reading the global bit line 231, four bit write circuits 245, 246, 247 and 248 for driving the global bit line 231, four cross coupled inverter latches 251, 252, 253 and 254 for storing data from one of four local sense amps or write data, and common circuits including a data receive circuit 260 including a column select circuit 260', and a data transfer circuit 270, where the cross coupled inverter latches include two inverters 255 and 256, and a select transmission gate 258 for multiplexing the common circuits while a read selector 274 is selected for reading or a receive switch 267 is selected for writing, which reduces repeating circuits for avoiding wiring congestions in the global sense amp area. And inverting buffers are included such that a column write signal 261 is connected to a NAND gate 265 and an inverter 266 for enabling the receive switch 267 through output 265' and 266', respectively. And inverters 262 and 263 are buffered for the next memory block 280. For reducing the repeating circuits further, the column select circuit 260' (which is part of the data receive circuit 260) is shared by adjacent memory block 200'. And the returning buffer 286 is used for buffering the returning read line 285.

The bit read circuit 241 includes a global reset transistor 232, a bit read transistor 233 for reading the global bit line 231 and a read enable transistor 234 for enabling the bit read transistor 233. The bit write circuit 245 includes a write inverter 235 connecting to the cross coupled inverter latch 251 through a latch node 237, and a write transmission gate 236 driving the global bit line 231. And the cross coupled inverter latch 251 includes two inverters 255 and 256, a latch reset transistor 257 and the select transmission gate 258 which is controlled by column select signals 258A and 258B. And the bit read circuit 241 is connected to a locking signal 296 as a read duration control signal for disabling after the read output is reached to the cross coupled inverter latch 251, such that the read enable transistor 234 is disabled by asserting the locking signal 296 which is generated by a locking signal generator 290, wherein the locking signal generator 290 is composed of an AND gate 292 for receiving an output from the cross coupled inverter latch 251, a tunable delay circuit (shown in FIG. 6A) for delaying the read output of the cross coupled inverter latch 251, an AND gate 294 and a buffer 295 for generating the locking signal 296 when a block read enable signal 291 is asserted to high. And the locking signal 296 is generated as long as one reference memory cell works correctly.

The data receive circuit 260 includes the receive switch 267, where the receive switch 267 is enabled by block write signals 265' (low) and 266' (high). And the receive switch 267 is connected to the cross coupled inverter latch 251 for transferring a write input to the memory cell through the bit write circuit 245 and the write transistor 228 of the non-inverting local sense amp 220.

And the data transfer circuit 270 includes a bypass tri-state inverter 273 connecting to the forwarding write line 264', a read inverter (read buffer) 277 connecting to a common node 276, and a read selector 274 connecting the cross coupled latch 251 for transferring the read output, wherein the common node 276 is reset by a common reset transistor 275 when the block write signal 269 is asserted to high during write operation. But, during read operation, the common node 276 receives an output from the cross coupled inverter latch 251 through the read selector 274 while the common reset transistor 275 is turned off and the bypass tri-state inverter 273 is turned off by block select signals 271(H) and 272(L) for the selected block 200 and 200', but the bypass tri-state inverter 281 in unselected blocks 280 and 280' is turned on for bypassing the read output. And other unselected read switch and unselected common reset transistor (not shown) keep turn-off state in the unselected blocks. Thus, the read output is transferred to an output node 287 through inverting buffers including 277, 281, 282, 283, 284 and 286.

During read operation, a stored data in the memory cell 210 is transferred to the cross coupled inverter latch 251 by the non-inverting local sense amp 220 through the global bit line 231, for instance, high data is transferred to the cross coupled inverter latch 251 by the non-inverting local sense amp 220 with high gain, but low data is not transferred by the non-inverting local sense amp with low gain because the bit read circuit 241 connecting to the cross coupled inverter latch 251 is disabled by the locking signal 296 which is generated by high data, before low data is arrived. Furthermore, the cross coupled inverter latch 251 is also used for write-back operation when the memory cell is accessed because the stored data in the memory cell 210 is destructed by the charges of the local bit line when reading.

Alternatively, in order to realize low power consumption during standby, the first amplify transistor 223, the second amplify transistor 226 and the bit read transistor 233 are composed of slightly longer transistor than those of the local pre-charge transistor 222, the global reset transistor 232, and the write transmission gate 236 while output of the write inverter 235 keeps low during standby. In doing so, turn-off current of the amplify transistors is reduced during operation and standby mode.

The first amplify transistor 223 is stronger than the memory cell, and the segment amplify transistor 233 is much stronger than the first amplify transistor 223 with wide channel transistor, for transferring the read output quickly.

For high voltage operation, such as burn-in operation, a source line 223A of the first amplify transistor 223 is connected to higher than ground voltage. By raising the source line 223A of the first amplify transistor 223 to higher than ground voltage, trip point (as shown in FIG. 2C) of the inverting amplifier is adjusted. Without adjustment, the inverting amplifier is difficult to differentiate for reading data "1" and data "0". And the source line 223A is connected to a bias voltage generator (not shown), for burn-in operation or adjusting the trip point during normal operation. In contrast, for low voltage operation, the first amplify transistor 223 is composed of a low threshold MOS transistor for lowering the trip point, as an alternative configuration.

Furthermore, the sense amp need not reference bit line because the sense amp does not compare voltage or current with reference bit line, but the sense amp detects whether the first amplify transistor 223 is turned on or not by the selected memory cell through the local bit line.

For writing data, the data receive circuit 260 receives a write data through the forwarding write line 264'. Thus, the write data is transferred to the memory cell 210 through the bit write circuit 245, the cross coupled inverter latch 251, and the receive switch 267, when the write transistor 228 in the non-inverting local sense amp 220 is enabled by asserting the write enable signal 299. And the write enable signal 299 is generated by a NOR gate 298C when a write control signal 298A is asserted to low, and the NOR gate 298C receives a delayed signal of the locking signal through another tunable delay circuit 297 and a buffer 298B. For avoiding NMOS threshold voltage drop, the write enable signal 299 is asserted to higher than VDD+VT voltage by a level shifter (not shown), where VDD is supply voltage and VT is threshold voltage of the MOS transistor. And the word line 211 is raised to higher than VDD+VT voltage, alternatively. During write operation, the local select transistor 227 is disabled for transferring the write data to the memory cell through the global bit line 231 and the bit write circuit 245.

Referring now to FIG. 2B in view of FIG. 2A, hysteresis curve of the ferroelectric capacitor 214 is illustrated. When writing data "1", the capacitor is polarized at P1, and then the P1 is moved to P1' during standby. And when reading data "1", capacitance C1 is exhibited, because the capacitor is reversely polarized by raising the plate line from low to high while the storage node 213 is reset to low. In contrast, when writing data "0", the capacitor is polarized at P0, and then the P0 is moved to P0' during standby. And when reading data "0", capacitance C0 is exhibited, because the capacitor is polarized in same direction by raising the plate line from low to high while the storage node 213 is reset to low.

Referring now to FIG. 2C in view of FIG. 2A, I-V curve of the inverting amplifier including NMOS 223 and PMOS 225 is illustrated when reading. When the memory cell 210 stores data "1", the ferroelectric capacitor 214 is polarized to positive direction, so that the local bit line 221 is raised from VSS voltage to VBL1 voltage by raising the plate line 215, when the local pre-charge transistor 222 is turned off by de-asserting a pre-charge signal 222A to low, and the word line 211 is asserted to a predetermined voltage. For instance, the local bit line is raised from 0V to VBL1 voltage, where local bit line capacitance is 1fF and the exhibited capacitance (C1 as shown in FIG. 2B) is 1fF. Thereby the inverting amplifier is turned on, which lowers the amplify node 224 near ground voltage, As a result, the second amplify transistor 226 is turned on. And strength of the NMOS 223 is much stronger than that of PMOS 225 for lowering a trip point below VBL1 voltage.

On the contrary, in FIG. 2D, when the stored voltage in the memory cell is data "0", the ferroelectric capacitor 214 is polarized to negative direction. For instance, the local bit line is raised from 0V to VBL0, where local bit line capacitance is 1fF and the exhibited capacitance (C0 as shown in FIG. 2B) is 0.3fF. Thereby the amplify node 224 keeps near supply voltage, which turns off the second amplify transistor 226.

Referring now to FIG. 2E in view of FIG. 2A, detailed timing diagram when reading data "1" is illustrated. To read data, the pre-charge (PC) signal 222A is de-asserted to low for releasing the local bit line 221, and the word line 211 is raised to a predetermined voltage while the write transistor 228 is turned off by write enable (WE) signal 299. And the plate line 215 is raised, so that the local bit line (LBL) 221 is charged to VBL1 voltage from VSS voltage because the ferroelectric capacitor 214 is pulled up by the plate line 215. The charged voltage VBL1 is determined by capacitance ratio between the ferroelectric capacitor 214 and the local bit line 221. Higher ferroelectric capacitance pulls up higher bit line voltage. Thus the inverting amplifier including NMOS 223 and PMOS 225 changes the amplify node (AMN) 224 near VSS voltage from VDD voltage while the source line 223A keeps near VSS voltage.

By changing the amplify node (AMN) 224, the second amplify transistor 226 is turned on, which pulls up the global bit line (GBL) 231, while the local select transistor 227 is turned on by the local enable signal 227A, but the global reset transistor 232 and the transmission gate 236 keep turn-off state. When the global bit line 231 is raised to VDD voltage, the cross coupled inverter latch 251 including inverters 255 and 256 is changed from the pre-charge state by turning on the read transistor 233 while the read enable transistor 234 is turned on, but the latch reset transistor 257 is turned off. And the latched high data in the cross coupled inverter latch 251 raises the common node 276 to high from reset state through column selector 258, an internal node 259 and the read selector 274, so that the column selector signals 258A and 258B select 1 of 4 columns (251, 252, 253 and 254) and the read selector 274 is selected by read enable signals 279 and 279' for reading, while the receive switch 267 is turned off. And then, high data in the common node voltage 276 is transferred to the output node (DO) 287 through inverting buffers including 277, 281, 282, 283, 284 and 286.

After reading, write-back operation is executed, such that the read data in each cross coupled inverter latch 251 is written back to the memory cell through the write transistor 228, when the write enable signal 299 is asserted to VDD or VDD+VT voltage. Or read-modify-write operation can be executed, where broken lines in LBL 221 and GBL 231 illustrate to modify from data "1" to data "0", so that the local bit line is inverted by the modified data. And then the plate line (PL) 215 of the memory cell is returned to low for completing the write back operation. After write-back operation, all the control signals including the pre-charge (PC) signal 222A, the word line, and other control signals, are returned to reset/pre-charge state or standby mode. And, during standby, the forwarding write line 264' and the forwarding read line 278 keep high for resetting the common node 276 to low, because the bypass tri-state inverter 273 is turned on, which avoids a conflict.

Referring now to FIG. 2F in view of FIG. 2A, detailed timing when reading data "0" is illustrated, wherein the local bit line (LBL) 221 is slightly raised to VBL0 voltage, but the VBL0 voltage is below the trip point of the inverting amplifier, which does not turn on the second amplify transistor 233 strongly. Thereby, the global bit line 231 keeps VSS voltage, which does not change the cross coupled inverter latch 251. And other read path keeps reset/pre-charge state. Hence the data output (DO) 287 keeps low. However, the local bit line 221 may be charged by leakage current after long time while it is floating, and which may change the global bit line 231. Hence, the global bit line 231 may turn on the read transistor 233 while the read enable transistor 234 is enabled. In order to avoid the false flip with leakage current when reading data "0", the read enable transistor 234 is turned off by the locking signal 296 which is generated by the locking signal generator 290 receiving fast data (data "1") with delay time as shown TD, so that data "0" is rejected to be latched to the cross coupled inverter latch because the false flip is very slowly occurred. This means that the cross coupled inverter latch 251 keeps the reset state, when reading data "0", so that this operation is called "locking" with the locking signal 296. After reading data "0", the write-back operation is executed by asserting the write enable signal 299. And then, all the control signals including the word line, the write enable signal and others are returned to reset/pre-charge state or standby mode. Alternatively, for reducing turn-off current, long channel transistors can be used for the first amplify transistor 223 and the second amplify transistor 227, while the local pre-charge transistor 222, the pull-up transistor 225 and the global reset transistor 232 can be composed of relatively short channel transistor, which helps to keep the reset state when reading data "0".

In this manner, the locking signal 296 effectively differentiates data "1" and data "0" where the memory block 200 and 280 serve as reference memory blocks storing data "1" while main memory blocks 200' and 280' store main data, so that this sensing scheme is called "a time domain sensing scheme", which can differentiate data "1" and data "0" within a predetermined time domain even though the leakage current is relatively high. Thereby, data "1" in the (reference) memory cell 210 is quickly transferred to the cross coupled inverter latch 251 through the local sense amp with high gain, which generates the locking signal, but data "0" is not transferred with low gain, thus the locking signal effectively rejects data "0" not to be latched. In other words, fast cycle memory (with no page mode) does not require the locking signal which is generated by the reference signal based on reference cells storing data "1", because data "0" is not reached to the latch within a short cycle. Thus, an enable signal (not shown) from a control circuit is used to control the read enable transistor 234 for fast cycle operation, which does not require reference cells and related circuits. And by applying multi-divided bit line architecture, fast read operation and write operation are realized. And also the memory cell can be reduced, because the memory cell drives only lightly loaded bit line, which means that the capacitor can be reduced for realizing very high density memory.

Referring now to FIG. 2G in view of FIG. 2A, simulated waveforms when reading data "1" with SPICE (Simulation Program with Integrated Circuit Emphasis) simulator are illustrated, wherein the waveforms are duplicated from actual simulator output. The word line (WL) 211 is asserted for selecting the memory cell 210, and then the plate line (PL) 215 is asserted to high for pulling up the memory cell. The storage node (SN) 213 is coupled by the capacitor 214 when the plate line 215 is pulling up. By coupling the storage node 213, the local bit line (LBL) 221 is raised to VBL1 voltage, so that the amplify node (AMN) 224 is lowered by the first amplifier. By lowering the amplify node (AMN) 224, the second amplifier is turned on, which pulls up the global bit line (GBL) 231. Hence the latch node (LAT) 237 is flipped by the bit read transistor 233 while the bit read enable transistor 234 is turned on. And the latched data of the latch node (LAT) 237 is transferred to the data output (DO) 287 through the returning read path. At the same time, the write enable signal 299 is generated by a delayed signal of the latched data, which is used for restoring the read data as a write back operation, such that the capacitor is positively polarized, while the storage node is at high and the plate line is at low.

Referring now to FIG. 2H in view of FIG. 2A, simulated waveforms when reading data "0" with SPICE simulator are illustrated, wherein the word line (WL) 211 is asserted for selecting the memory cell 210, and then the plate line (PL) 215 is asserted. And the storage node (SN) 213 is also raised by the capacitor 214. By raising the storage node 213, the local bit line (LBL) 221 is raised to VBL0 voltage because the polarized capacitance of the memory cell storing data "0" is lower than that of storing data "1", so that the amplify node (AMN) 224 is not fully lowered much by the first amplifier. As a result, the global bit line (GBL) 231 keeps low, which does not pull down the latch node (LAT) 237. Hence, the data output (DO) 287 is not changed by the latch node 237. And, the write back operation is executed by the write enable signal 299 which is generated by reading data "1" as explained above. During write back operation, the capacitor is negatively polarized, while the storage node is at low and the plate line is at high.

Referring now to FIG. 2I in view of FIG. 2A, simulated waveforms are separately illustrated for ease of understanding, wherein the word line (WL) 211 is asserted first for selecting the memory cell 210, and then the plate line (PL) 215 is asserted for pulling up the memory cell. In the waveforms, the solid line of the storage node SN (H) 213 shows data "1", which is raised to higher than the broken line showing the storage node SN (L) 213 for reading data "0".

Referring now to FIG. 2J in view of FIG. 2A, simulated waveforms of the local bit lines are illustrated, wherein the solid line shows the local bit line LBL 221 (H) when reading data "1", and the broken line shows the local bit line LBL 221 (L) when reading data "0".

Referring now to FIG. 2K in view of FIG. 2A, simulated waveforms of the amplify nodes are illustrated, wherein the solid line shows the amplify node AMN 224 (H) when reading data "1", and the broken line shows the amplify node AMN 224 (L) when reading data "0".

And referring now to FIG. 2L in view of FIG. 2A, simulated waveforms of the global bit lines are illustrated, wherein the solid line shows the global bit line GBL 231 (H) when reading data "1", and the broken line shows the global bit line GBL 231 (L) when reading data "0".

In FIG. 3A, an alternative memory segment 300 is illustrated for configuring a volatile memory, wherein the plate line 315 is connected to a constant voltage, such as, a ground voltage and a supply voltage, in the memory segment 300. Basically, the configuration of the memory segment 300 is the same as that of FIG. 2A, except the plate line 315 is connected to a constant voltage source and the local bit line 321 is pre-charged to a pre-charged voltage (VPRE), wherein the memory cell 310 includes the pass transistor 312 and the ferroelectric capacitor 314 through the storage node 313 and the pass transistor 312 is connected to the word line 311. And the memory cell 310 is connected to a right (non-inverting) local sense amp 320 through the local bit line 321, and another memory cell 310' is connected to a left (non-inverting) local sense amp 320' through the local bit line 321'. The right local sense amp 320 is composed of the first amplifier including the first amplify transistor 323 and the pull-up transistor 325, the second amplifier including the second amplify transistor 326 and the local enable transistor 327, the pre-charge transistor 322 and the write transistor 328.

In order to pre-charge the local bit line to a pre-charge voltage (VPRE), such as, half VDD voltage or near half VDD voltage, the pre-charge transistor 322 is connected to the pre-charge node 322A. By pre-charging the local bit line near half VDD voltage, negative word line voltage is applied when storing data "1", such that the storage node 313 is charged to VDD voltage and the local bit line is pre-charged to half VDD voltage while the word line 311 is forced to ground voltage during standby. With negative word line scheme, the sub-threshold leakage current is dramatically reduced during storing data "1", while data "0" is not read by the local sense amp in the present invention. Hence, there is no concern about losing data "0", and retention time for data "1" is significantly increased with negative word line scheme. In the present invention, the word line is actually forced to ground voltage while the source and the drain are higher than the voltage of the word line, so that there is less affected by gate-induced drain leakage current as shown in the prior art, which forces negative (minus) voltage to the word line, "Impact of Gate-Induced Drain Leakage on Retention Time Distribution of 256 Mbit DRAM With Negative Wordline Bias", IEEE Electron Devices, Vol. 50, No. 4, April 2003.

And one more bias voltage 323A is connected to the first amplify transistor 323 for adjusting the trip point of the inverting amplifier. For example, the bias voltage 323A is raised to 0.3V during burn-in operation. Thus, the inverting amplifier operates at least higher than 0.3V, which can detect the local bit line voltage more accurately, because the supply voltage is increased to high voltage, for example, 3V, during burn-in operation.

Referring now to FIG. 3B in view of FIG. 3A, simulated waveforms when reading data "1" with SPICE simulator are illustrated, wherein the word line (WL) 311 is asserted for selecting the memory cell 310, but the plate line (PL) 315 is forced to VSS voltage (not shown) for avoiding reverse polarization, which eliminates fatigue of the ferroelectric capacitor after long time use. The local bit line (LBL) 321 is raised to V1 voltage, so that the amplify node (AMN) 324 is lowered by the first amplifier. By lowering the amplify node (AMN) 324, the second amplifier is turned on, which pulls up the global bit line (GBL) 331, when the local enable signal 327A is asserted to low. Hence the latch node (not shown) is flipped by pulling up the global bit line 331. At the same time, the write enable signal is generated by a delayed signal of the latched data, which is used for restoring the read data as the write back operation, as explained above.

Referring now to FIG. 3C in view of FIG. 3A, simulated waveforms when reading data "0" are illustrated, wherein the word line (WL) 311 is asserted for selecting the memory cell 310, while the plate line (PL) 315 is forced to ground voltage (not shown). After raising the word line, the local bit line (LBL) 321 is slightly lowered to V0 voltage because the memory cell stores ground voltage for storing data "0" in the volatile mode as a DRAM (Dynamic Random Access Memory) operation. And voltage difference DV is exhibited between data "1" and data "0", which voltage can be amplified by the first amplifier. Thus, the amplify node (AMN) 324 is not lowered by the first amplifier. As a result, the global bit line (GBL) 331 keeps low, which does not pull down the latch node. Hence, the data output is not changed by the latch node. However, the write back operation is executed by the write enable signal which is generated by reading data "1" (as shown in FIG. 3B), where other operation is similar to that of FIG. 2A.

Alternatively, volatile mode to nonvolatile mode can be switched by the plate line as a prior art, U.S. Pat. No. 5,297,077. Furthermore, regular dielectric can be used for serving as the capacitor 314 for storing charges, which equally works as the DRAM for serving as a volatile mode.

In FIG. 4A, an alternative memory segment 400 for replacing SRAM (Static Random Access Memory) is illustrated, wherein the plate line 415 is fixed at half VDD voltage for polarizing when the storage node is forced to VDD voltage for polarizing and storing data "1" and VSS voltage for polarizing and storing data "0". And the storage node (SN) 414 is connected to a pre-charge transistor 416 connecting to a pre-charge control signal 417 for pre-charging the storage node to half VDD voltage during standby, such that the memory cell 410 includes the pass transistor 412, the pre-charge transistor 416 and the ferroelectric capacitor 414, where the pass transistor is connected to the word line 411. And the memory cell 410 is connected to a right local sense amp 420 through the local bit line 421, and another memory cell 410' is connected to a left local sense amp 420' through the local bit line 421'. The right local sense amp 420 is composed of the first amplifier including the first amplify transistor 423 and the pull-up transistor 425, the second amplifier including the second amplify transistor 426 and the local enable transistor 427, the pre-charge transistor 422, and the write transistor 428. The bias voltage 423A for the first amplifier is connected to the first amplify transistor 423 for adjusting the trip point of the inverting amplifier. The local enable transistor 427 is selected by the local enable signal 427A. And the local enable transistor 427 is shared with next local sense amp (not shown) for reducing area, where the drain node 426A is used to connect the next local sense amp. In operation, the bias voltage 423A is forced at VDD voltage for turning off the second amplify transistor 426, during standby or unselected. Detailed layout will be illustrated as below in FIG. 8A to 8C.

Referring now to FIG. 4B in view of FIG. 4A, simulated waveforms when reading data "1" with SPICE simulator are illustrated, wherein the pre-charge control line 417 is de-asserted to low first, and then the word line (WL) 411 is asserted to high for selecting the memory cell 410, but the plate line (PL) 415 is fixed at half VDD voltage (not shown). By asserting the word line 411, the local bit line (LBL) 421 is settled to VB1 voltage, because charges in the storage node 413 and the local bit line 421 are re-distributed, so that the amplify node (AMN) 424 is lowered by the first amplifier, while the trip point of inverting amplifier is lower than VB1 voltage as shown in FIG. 2C. By lowering the amplify node (AMN) 424, the second amplifier is turned on, which pulls up the global bit line (GBL) 431. And during write operation, the storage node 413 is fully charged to VDD voltage through the write transistor 428 for storing data "1", which polarizes the ferroelectric capacitor positively, while the plate line 415 is fixed at half VDD voltage. And other operation for transferring data is the same as above.

Referring now to FIG. 4C in view of FIG. 4A, simulated waveforms when reading data "0" are illustrated, wherein the word line (WL) 411 is asserted for selecting the memory cell 410, while the plate line (PL) 415 is fixed at half VDD voltage. After the word line is asserted, the local bit line (LBL) 421 is raised to VB0 voltage by little charges in the storage node 413, because the capacitance value of data "0" is much lower than that of data "1". Thus, the amplify node (AMN) 424 is not lowered by the first amplifier. As a result, the global bit line (GBL) 431 keeps low. And then the storage node 413 is fully discharged to VSS voltage through the write transistor 428 for storing data "0", which polarizes the ferroelectric capacitor negatively. And other operation is the same as above in FIG. 2A.

Furthermore, the ferroelectric capacitor memory cell 410 can configure a series connection as a chain FRAM, as published, "High-Density Chain Ferroelectric Random Access Memory (Chain FRAM)", IEEE Journal of Solid-State Circuits, Vol. 33, No. 5, May 1998. And more prior arts are published, U.S. Pat. No. 6,552,922 and No. 6,664,158. However, conventional memory architecture uses heavy bit line, so that the ferroelectric capacitor should be big enough to charge and discharge the heavy bit line. On the contrary, in the present invention, for reducing the ferroelectric capacitor, the local bit line 421 is lightly loaded, so that the lightly loaded bit line is driven by a series memory cell string including small memory cells. This means that the ferroelectric capacitor is reduced near the capacitance value of the local bit line. For example, the ferroelectric capacitor can be reduced to 1fF only if the local bit line capacitance is reduced to 1fF.

Figure 4D:
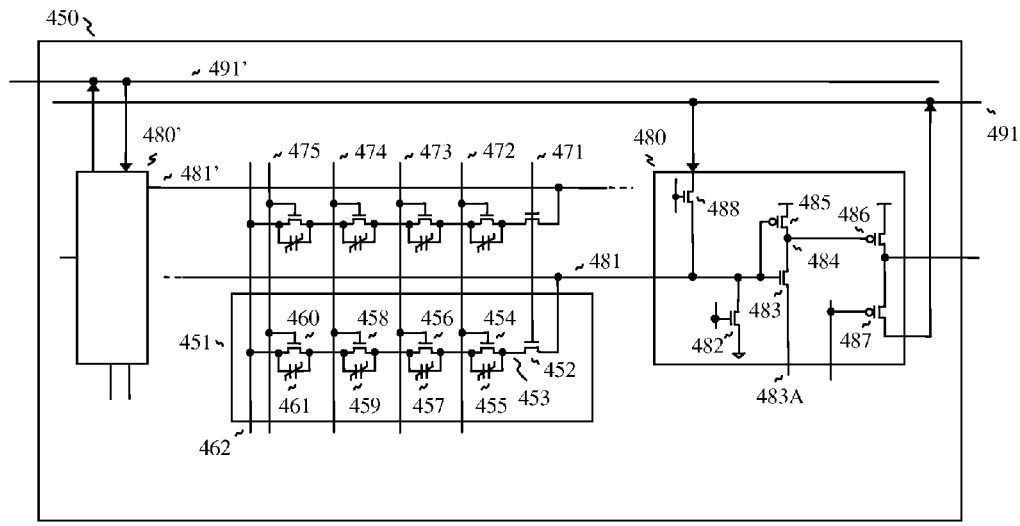
FIG. 4D illustrates series memory cells, according to the teachings of the present invention.

An example configuration is illustrated in FIG. 4D, wherein a series memory cell string 451 includes a string select transistor 452, a first memory cell including a first access transistor 454 and a first ferroelectric capacitor 455, a second memory cell including a second access transistor 456 and a second ferroelectric capacitor 457, a third memory cell including a third access transistor 458 and a third ferroelectric capacitor 459, and a fourth memory cell including a fourth access transistor 460 and a fourth ferroelectric capacitor 461. The string select transistor 452 is connected to the string select signal 471, the first access transistor 454 is connected to the first word line 472, the second access transistor 456 is connected to the second word line 473, the third access transistor 458 is connected to the third word line 474, the fourth access transistor 460 is connected to the fourth word line 475.

And the plate line 462 is fixed at half VDD voltage for polarizing when the storage node is forced to VDD voltage for polarizing and storing data "1" and VSS voltage for polarizing and storing data "0" shown as the 2T1C memory cell (in FIG. 4A). The read and write operation are similar to those of FIG. 4A, such that the storage node 453 is pre-charged to half VDD voltage through the other access transistors during standby, because all access transistors are turned on. For reading the first memory cell 454, for example, the first access transistor 454 is turned off, while other access transistors 456, 458 and 460 keep turn-on state. Hence, capacitance value of the first ferroelectric capacitor is measured by turning on the string select transistor 452. For reading, the memory cell string is connected to a right local sense amp 480 through the local bit line 481, and another memory cell string is connected to a left local sense amp 480' through the local bit line 481'. The right local sense amp 480 is composed of the first amplifier including the first amplify transistor 483 and the pull-up transistor 485, the second amplifier including the second amplify transistor 486 and the local enable transistor 487, the pre-charge (or reset) transistor 482, and the write transistor 488. By turning on the string select transistor 452, the voltage difference is exhibited in the local bit line 481, while the pre-charge transistor 482 and the write transistor 488 are turned off. And other operation is similar to that of FIG. 4A, for transferring the read output to the global line 491 and 491'.

The non-inverting local sense amp 480 serving as a single ended sense amp works, as long as the voltage difference between data "1" and data "0" is enough high. For example, 200 mV is good enough for sensing with optimum bias voltage 428A in order to adjust the trip point of the inverting amplifier 483 and 485. However, when the series memory cells are increased for increasing density more, the single ended local sense amp is difficult to sense the voltage difference, because parasitic capacitance is increased by adding more series memory cells. Hence, differential amplifier is still useful for reading the stored data with comparing a reference bit line. And the local bit line is still lightly loaded, so that the ferroelectric capacitor is small, for instance, 1fF.

Figure 5A:
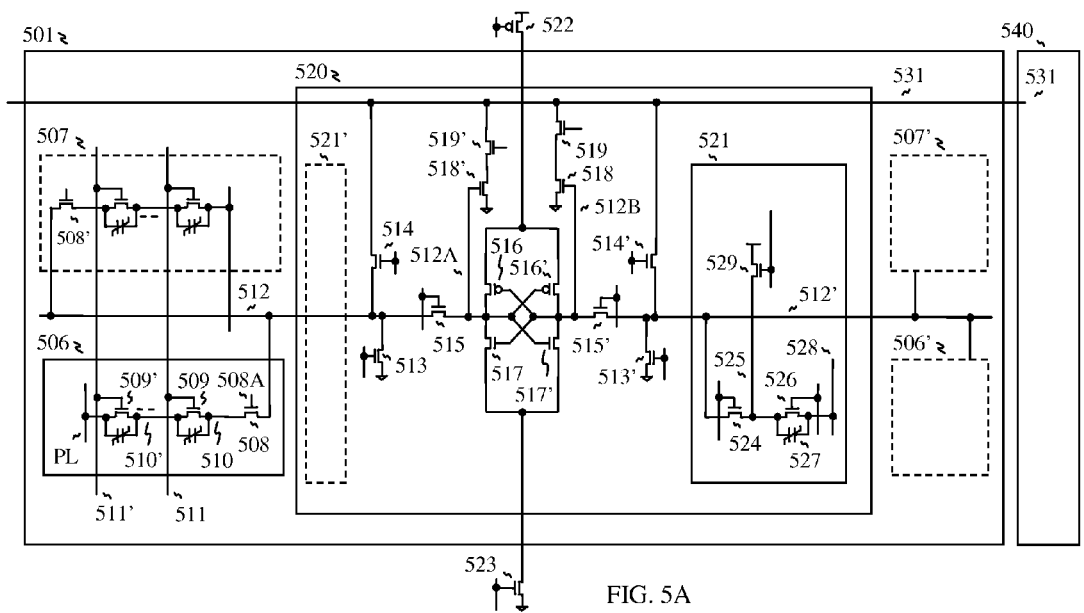
FIG. 5A illustrates an alternative configuration for reading the series memory cells.

In FIG. 5A, detailed circuit is illustrated for reading the series memory cell string 506 with differential amplifier. In order to realize very high density nonvolatile memory, more series memory cells are added to 8, 16 and 32 cells, even though the drawing shows two memory cells, wherein the series memory cell string 506 is composed of the string select transistor 508, the first memory cell including the first access transistor 509 and the first capacitor, and the second memory cell including the second access transistor 509' and the second capacitor connecting to the plate line (PL). And the plate line (PL) is forced to a constant voltage, such as, half VDD voltage. In particular, the local bit lines 512 and 512' are shielded by the global bit line 531, when reading the memory cell, in order to reduce coupling noise, because only one memory cell string is activated by selecting one of string select transistors 508 and 508'. Thus, the global bit line serves as a shielding line when the local sense amp reads the memory cell. In metal routing, the local bit line 512 is passing over the memory cell string 506 while the global bit line 531 is passing over the other memory cell string 507. And this configuration enables to widen the local sense amp layout (not shown) for matching 4 bit line pitch.

For reading the memory cell, the (non-inverting) local sense amp 520 is composed of a differential amplifier, wherein the differential amplifier is used for sensing the voltage difference of the local bit line more accurately even though the signal difference is reduced. The local sense amp 520 is connected to the left memory cell strings 506 and 507 through the left local bit line 512, and the right memory cell strings 506' and 507' through the right local bit line 512'. And the differential amplifier includes pull-up transistors 516 and 516', and pull-down transistors 517 and 517', reset transistors 513 and 513', read enable transistors 518 and 519, and 518' and 519', and write transistors 514 and 514'. And amp select transistors 515 and 515' are used to receive bit line voltages during read operation. Each local bit line is connected to reference memory cell 521 and 521'. The differential amplifier 520 is connected to a pull-up control transistor 522 and a pull-down control transistor 523 for enabling the differential amplifier, and the memory segment 501 is connected to the global sense amp 540 through the global bit line 531. The reference memory cell 521 is composed of a select transistor 524, an access transistor 526 and a capacitor 527, and a pull-up transistor 529, where a reference ferroelectric capacitor 527 is same size of the ferroelectric capacitor in the main memory cell string. Related operation will be explained as below.

Figure 5B:
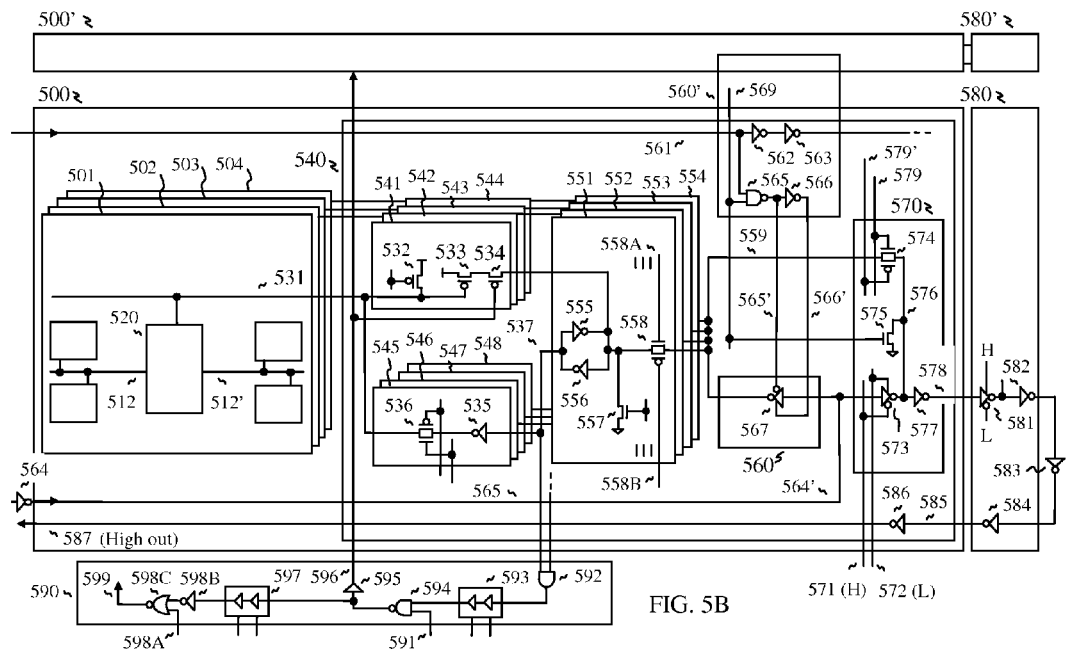
FIG. 5B illustrates a detailed schematic for the series FRAM.

In FIG. 5B, the related circuit for reading and writing the series memory cell is illustrated, wherein the global sense amp 540 is illustrated for connecting to the memory segments 501, 502, 503 and 504. And the memory segment 501 includes the local sense amp 520 (as shown in FIG. 5A), and most of blocks are the same as those of FIG. 2A, except reversed polarity of the global bit line 531 and the related circuits for controlling the reversed polarity.

For reading and writing the memory cell, the local bit line 521 is lowered from half VDD voltage by re-distributing charges in the storage node of the memory cell when the word line is selected and lowered. The local bit line voltage is determined by the value of the ferroelectric capacitor. For example, high value of the storage capacitor sets up higher local bit line voltage, while low value of the storage capacitor sets up lower local bit line voltage. Hence, the voltage difference of the local bit line is read by the local sense amp 520, and the output is transferred to the global sense amp through the global bit line 531. And the global sense amp 540 is also connected to next memory block 580.

More specifically, the global sense amp 540 includes four bit read circuits 541, 542, 543 and 544 for reading, four bit write circuits 545, 546, 547 and 548 for writing, four cross coupled inverter latches 551, 552, 553 and 554 for storing read data or write data, and common circuits including a data receive circuit 560 and 560', and a data transfer circuit 570, where cross coupled inverter latches 551, 552, 553 and 554 include a cross coupled inverter latch having two inverters 555 and 556, a reset transistor 557 and a select transmission gate 558 which is controlled by column select signals 558A and 558B for multiplexing the common circuits while a read selector 574 is selected by read enable signals 579 and 579' for reading, or a receive switch 567 is selected for writing, which reduces repeating circuits for avoiding wiring congestions in the global sense amp area. And inverting buffers are included such that a column write signal 561 is connected to a NAND gate 565 and an inverter 566 for enabling the receive switch 567 through output 565' and 566', respectively. And inverters 562 and 563 are buffered for the next memory block 580. For reducing the repeating circuits further, the receive control circuit 560' (which is part of the data receive circuit 560) is shared by adjacent memory block 500'. And the returning buffer 586 is used for buffering the returning read line 585.

The bit read circuit 541 includes a global pre-set transistor 532, a bit read transistor 533 for reading the global bit line 531 and a read enable transistor 534 for enabling the bit read transistor 533. The bit write circuit 545 includes a write inverter 535 connecting to the cross coupled inverter latch 551 through a latch node 537, and a write transmission gate 536 driving the global bit line 531. And the cross coupled inverter latch 551 includes a cross coupled inverters 555 and 556, a latch reset transistor 557 and the select transmission gate 558 which is controlled by column select signals 558A and 558B. And the bit read circuit 541 is connected to a locking signal 596 as a read duration control signal for disabling after the read output is reached to the cross coupled inverter latch 551, such that the read enable transistor 534 is disabled by asserting the locking signal 596 which is generated by a locking signal generator 590, wherein the locking signal generator 590 is composed of an AND gate 592 for receiving an output from the cross coupled inverter latch 551, a tunable delay circuit 593 (shown in FIG. 6A) for delaying the read output of the cross coupled inverter latch 551, a NAND gate 594 and a buffer 595 for generating the locking signal 596 when a block read enable signal 591 is asserted to high. And the locking signal 596 is generated as long as one reference memory cell works correctly.

The data receive circuit 560 includes the receive switch 567, where the receive switch 567 is enabled by block write signals 565' (low) and 566' (high). And the receive switch 567 is connected to the cross coupled inverter latch 551 for transferring a write input to the memory cell through the bit write circuit 545.

And the data transfer circuit 570 includes a bypass tri-state inverter 573 connecting to the forwarding write line 564', a read inverter 577 connecting to a common node 576, and a read selector 574 connecting the cross coupled inverter latch 551 for transferring the read output, wherein the common node 576 is reset by a common reset transistor 575 when the block write signal 569 is asserted to high during write operation. But, during read operation, the common node 576 receives an output from the cross coupled inverter latch 551 through the read selector 574 while the bypass tri-state inverter 573 is turned off by block select signals 571(H) and 572(L) for the selected block 500 and 500', but the bypass tri-state inverter 581 in unselected blocks 580 and 580' is turned on for bypassing the read output. And other unselected read switch and unselected common reset transistor (not shown) keep turn-off state in the unselected blocks. Thus, the read output (low out) is transferred to an output node 587 through inverting buffers including 577, 581, 582, 583, 584 and 586.

During read operation, a stored data in the memory cell is transferred to the cross coupled inverter latch 551 by the local sense amp 520 through the global bit line 531. For instance, high data is transferred to the cross coupled inverter latch 551 by the local sense amp 520 with high gain, but low data is not transferred by the local sense amp with low gain because the bit read circuit 541 connecting to the cross coupled inverter latch 551 is disabled by the locking signal 596 which is generated by high data, before low data is arrived. Furthermore, the cross coupled inverter latch 551 is also used for write-back operation when the memory cell is accessed because the stored data in the memory cell 510 is destructed by the charges of the local bit line.

For writing data, the data receive circuit 560 receives a write data through the forwarding write line 564' connecting to a write buffer 564. Thus, the write data is transferred to the memory cell through the bit write circuit 545, the cross coupled inverter latch 551, and the receive switch 567, when the write transistor 514 in the local sense amp 520 (in FIG. 5A) is turned on by the write enable signal 599. And the write enable signal 599 is generated by a NOR gate 598C receiving a delayed signal of another tunable delay circuit 597 through an inverter 598B when a write control signal 598A is asserted to low. During write operation, the local select transistors 518 and 518' in the local sense amp 520 are disabled for transferring the write data to the memory cell through the global bit line 531 and the bit write circuit 545. And amp select transistors 515 and 515' are turn off during write operation, so that the differential amplifier keeps reset state.

Figure 5C:
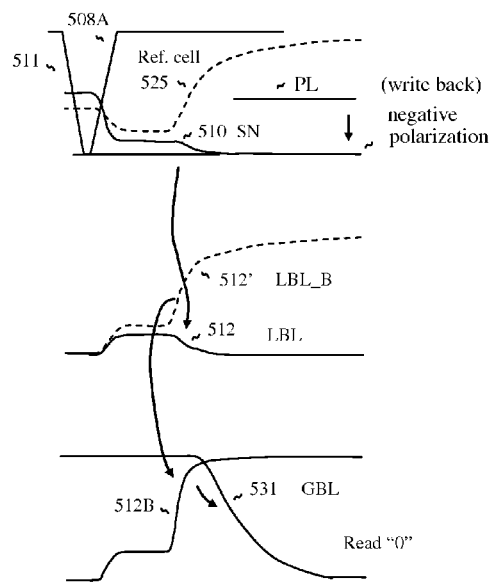
FIG. 5C illustrates simulated waveform when reading data "1"

Referring now to FIG. 5C in view of FIG. 5A, simulated waveforms when reading data "0" with SPICE simulator are illustrated, wherein the word line (WL) 511 is lowered from high for selecting the memory cell 509 (in FIG. 5A), but unselected word line 511' keeps high state and the plate line (PL) 515 is fixed at half VDD voltage. By lowering the word line 511, the access transistor 509 is turned off, and then the string select transistor 508 is turned on by raising the string select signal 508A, so that the local bit line (LBL) 512 is raised because charges in the storage node 510 (at half VDD voltage) and the local bit line 512 (at VSS voltage) are redistributed, where the settled voltage is determined by capacitance values between the storage capacitance and the local bit line capacitance. Simultaneously, right local bit line 512' serves as a reference bit line which is connected to the reference memory cell 521. For setting the reference voltage, the select transistor 524 is turned on, while the access transistor 526 is turned off. Hence, voltage of the reference bit line 512' is raised, because the reference storage node 525 is pre-charged by a reference voltage 528 to lower than half VDD voltage. For example, 200 mV lower voltage than half VDD voltage is pre-charged by the reference voltage 528 for exhibiting 100 mV higher than that of data "0", and 100 mV lower than that of data "1". After reading data, the ferroelectric capacitor of the reference memory cell 527 is positively polarized by the pull-up transistor 529 (in FIG. 5A) which sets up the reference storage node to high.

After setting the local bit line voltage and the reference bit line voltage, the differential amplifier is enabled by turning on the amp select transistors 515 and 515', and then related control circuits including the pull-up control transistor 522 and the pull-down control transistor 523 are turned on for starting the sensing, while the reset transistors 513 and 513', and the write transistors 514 and 514' keep turn-off state. Since the local bit line voltage is, for example, 100 mV lower than that of the reference bit line voltage, left sense amp node 512A (connected to the local bit line 512) is lowered by the differential amplifier, while right sense amp node 512B (connected to the reference bit line 512') is raised. Then, the read enable transistor 518 is turned on, while the other read enable transistor 518' keeps turn-off state. Hence, the global bit line 531 is discharged by the read enable transistor 519 and the read enable transistor 518, because the right sense amp node 512B is raised to high by the differential amplifier. After reading, the storage node (510 in FIG. 5A) of the selected memory cell is negatively polarized while the plate line (PL) keeps half VDD voltage. And the reference memory cell 521 (dummy cell) is positively polarized by turning on the pull-up transistor 529.

Figure 5D:
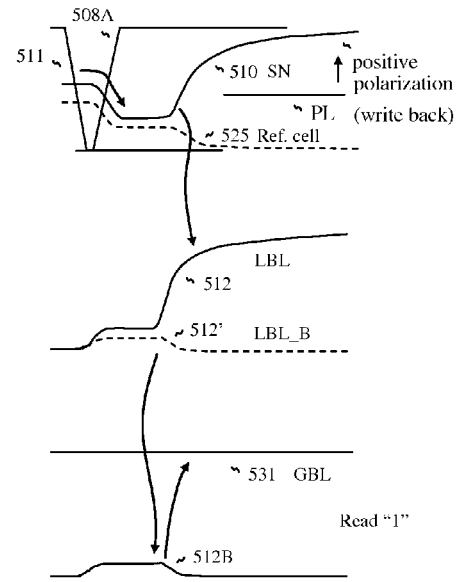
FIG. 5D illustrates simulated waveform when reading data "0" for the series FRAM, according to the teachings of the present invention.

In FIG. 5D, on the contrary, the right sense amp node 512B is not raised to high when reading data "1", because voltage of the local bit line 512 is, for example, 100 mV higher than that of the reference bit line 512'. Thus, the local bit line 512 is raised to high, but the reference bit line 512' is lowered, which keeps the right sense amp node 512B near VSS voltage. As a result, the global bit line 531 keeps high, because the read transistor 518 does not pull down the global bit line while the read enable transistor 519 is enabled. And after reading, the selected memory cell is positively polarized by the local bit line while the plate line (PL) keeps half VDD voltage. The reference memory cell is also positively polarized as explained above in FIG. 5C. Alternatively, the reference memory cell can be composed of regular capacitor for eliminating fatigue of the capacitor, because the reference capacitor sets up only a reference voltage with optimum reference voltage 528.

Figure 6A:
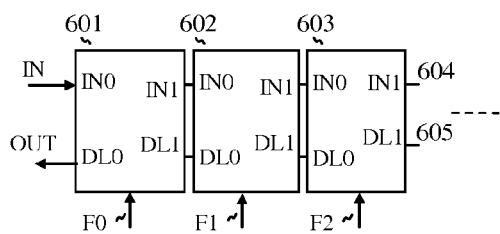
FIG. 6A illustrates a tunable delay circuit.

In FIG. 6A, detailed tunable delay circuit (as shown 293 in FIG. 2A) is illustrated, wherein multiple delay units 601, 602 and 603 are connected in series, the first delay unit 601 receives input IN and generates output OUT, the second delay unit 602 is connected to the first delay unit, and the third delay unit 603 is connected to the second delay unit 602 and generates outputs 604 and 605, and so on. Each delay unit receives a fuse signal, such that the first delay unit receives F0, the second delay unit receives F1, and a third delay unit receives F2. And more detailed delay unit is illustrated in FIG. 6B, wherein the delay unit 610 receives an input IN0 and a fuse signal Fi, thus the fuse signal Fi selects output from the input IN0 or input DL1, so that a transfer gate 611 is turned on when the fuse signal Fi is low and output of inverter 613 is high, otherwise another transfer gate 612 is turned on when the fuse signal Fi is high and output of inverter 613 is low to bypass DL1 signal. Inverter chain 614 and 615 delays IN0 signal for the next delay unit, where more inverter chains or capacitors can be added for the delay even though the drawing illustrates only two inverters.

Figure 6C:
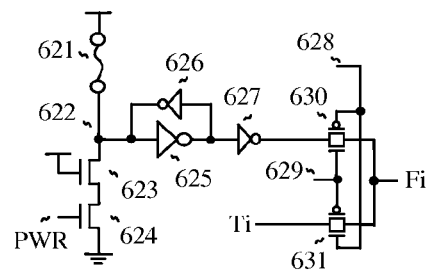
FIG. 6C illustrates a related fuse circuit for the tunable delay circuit, according to the teachings of the present invention.
Figure 6B:
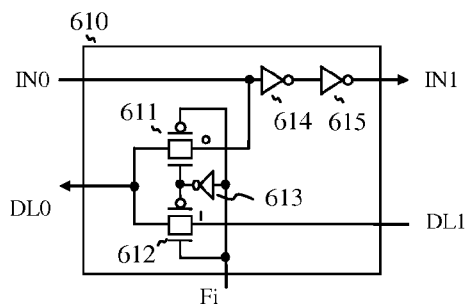
FIG. 6B illustrates a delay unit of the tunable delay circuit.

In FIG. 6C, a related fuse circuit of the tunable delay circuit (as shown in FIG. 6A) is illustrated in order to store information for the delay circuit, so that a fuse serves as a nonvolatile memory, wherein a fuse 621 is connected to a latch node 622, a cross coupled latch including two inverters 625 and 626 are connected to the latch node 622, pull-down transistors 623 and 624 are serially connected to the latch node 622 for power-up reset. Transfer gate 630 is selected by a select signal 629 (high) and another select signal 628 (low) in order to bypass the latch node output 622 through inverter 625 and 627. In doing so, fuse data is transferred to output node Fi, otherwise test input Ti is transferred to Fi when a transmission gate 631 is turned on.

Methods of Fabrication

The memory cells can be formed from single crystal silicon as the conventional FRAM cell. Alternatively, the memory cells can be formed from thin-film polysilicon layer within the current CMOS process environment. Furthermore, the memory cells can be formed in between the routing layers. In this manner, fabricating the memory cells is independent of fabricating the peripheral circuits on the surface of the wafer.

In order to form the memory cells in between the metal routing layers, LTPS (Low Temperature Polycrystalline Silicon) can be used, as published, U.S. Pat. No. 5,395,804, U.S. Pat. No. 6,852,577 and U.S. Pat. No. 6,951,793. The LTPS has been developed for the low temperature process (around 500 centigrade) on the glass in order to apply the display panel. Now the LTPS can be also used as a thin film polysilicon transistor for the memory device. The thin film based transistor can drive multi-divided bit line which is lightly loaded, even though thin film polysilicon transistor can flow less current than single crystal silicon based transistor on the surface of the wafer, for example, around 10 times weaker than that of conventional transistor, as published, "Poly-Si Thin-Film Transistors: An Efficient and Low-Cost Option for Digital Operation", IEEE Transactions on Electron Devices, Vol. 54, No. 11, November 2007, and "A Novel Blocking Technology for Improving the Short-Channel Effects in Polycrystalline Silicon TFT Devices", IEEE Transactions on Electron Devices, Vol. 54, No. 12, December 2007. During LTPS process, the MOS transistor in the control circuit and routing metal are not degraded. And the steps in the process flow should be compatible with the current CMOS manufacturing environment as published, U.S. Pat. No. 5,990,507, No. 5,638,319, No. 6,075,264, and No. 6,967,365 for forming FRAM memory cell. And forming the thin film transistor is similar to TFT (thin film transistor) SRAM, as published, U.S. Pat. Nos. 6,670,642 and 6,828,689. In this respect, detailed manufacturing processes for forming the memory cell, such as width, length, thickness, temperature, forming method, or any other material related data, are not described in the present invention.

Figure 7C:
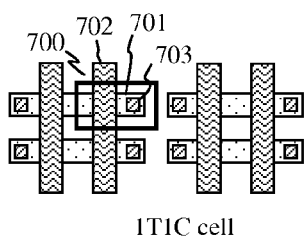
Figure 7C:
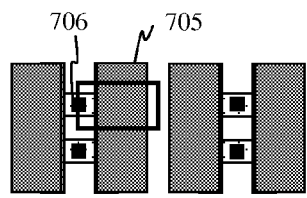
Figure 7B:
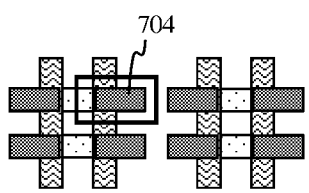
Figure 7D:
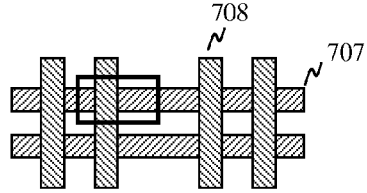

In FIGS. 7A, 7B, 7C and 7D, an example layout for configuring an open bit line memory cell array is illustrated. A solid line 700 depicts a memory cell. In the process steps, the active region 701 is formed first, and gate oxide (not shown) is formed on the active region, then gate poly 702 is formed on the gate oxide region. After then capacitor contact region 703 is formed as shown in FIG. 7A. Then, a storage node 704 is formed on the capacitor contact region 703 as shown in FIG. 7B. After forming the storage node (bottom plate) 704, an insulation layer (not shown) is formed on the storage node 704. Then, a capacitor plate (top plate) 705 is formed on the storage node 704 as shown in FIG. 7C. After then, contact region 706 is formed. In FIG. 7D, a first metal layer 707 for the local bit line is formed on the contact region 706 (in FIG. 7C). And a second metal layer 708 for the global word line is formed on the first metal layer 707, as shown in FIG. 7D. In this open bit line structure, one word line is used to control a memory cell with no passing word line, which makes a straight word line in shape. Hence, the open bit line structure occupies 6F.sup.2 in general while F is minimum feature size for fabrication, which reduces chip area. Furthermore, half of row decoders are reduced with no passing word line, which reduces chip area as well.

More detailed array configuration is illustrated in FIG. 7E, wherein a memory cell 710A is connected to the local bit line 721A which is connected to the local sense amp 720A to read the memory cell with a word line 712, and the global bit line 741A is connected to the local bit line 717 through write transfer transistor (not shown) of the local sense amp 720A. And other memory cell 710B is connected to the local bit line 721B which is connected to the local sense amp 720B to read data with the same word line 712. When reading data, the word line 712 is asserted to a predetermined voltage. Thus, the read output from the memory cell 710A is transferred to the local sense amp 720A connecting to the global bit line 731A, and another read output from the memory cell 710B is transferred to the local sense amp 720B connecting to the global bit line 731B, while other local sense amps 720C and 720D are not activated. The output is transferred to block sense amp (not shown) through the global bit line 731A for the memory cell 710A and another global bit line 731B for the memory cell 710B.

In FIGS. 8A, 8B and 8C, example layout for the local sense amp 820 is illustrated, wherein the local sense amp 820 includes poly gate 828 as the write transfer transistor, and poly gate 822 as the local pre-charge transistor or a pre-charge transistor, the inverting amplifier having an NMOS 823 as the first amplify transistor and a PMOS 825 as the pull-up transistor, and the second amplifier includes the second amplify transistor 826 and the local select transistor 827. NMOS transistors 822, 823 and 828 are composed of n+ active region on p-well region PW, and PMOS transistors 825, 826 and 827 are composed of p+ region on n-well region NW. Contact region CT is formed on the active region and poly region for connecting metal-1 region. And metal-1 region M1 and via-1 region VA1 are defined as shown in FIG. 8B, such that metal-1 bit line 821 is connected to the pre-charge transistor 822, the write transistor 828 and the first amplify transistor 823 (in FIG. 8A). Metal-1 region 831 on the write transistor 828 is defined to connect to the global bit line, the source line 823A is defined to force a bias voltage to the first amplify transistor 823, the amplify node 824 is defined to connect to the inverting amplifier, and the second amplifier output is defined to connect to the global bit line 831. And in FIG. 8C, metal-2 region M2, via-2 VA2 and metal-3 M3 are defined, such that the global bit line 831 is connected to the write transistor 828 through via-1 and metal-1 region, and also connected to output node of the local select transistor 827 through via-1 and metal-1 region. And the local select signal 827A is connected to the local select transistor 827 through the metal and via layers.

In FIG. 8D, an equivalent circuit of the local sense amp is illustrated wherein the memory cell 810 is connected to the local bit line 821. The first amplifier includes the pre-charge transistor 822, the write transfer transistor 828 and the first amplify transistor 823 which configures the inverting amplifier with the pull-up transistor 825. The bias voltage 823A is connected to the first amplify transistor 823. And the second amplifier includes the second amplify transistor 826 and the local select transistor 827. The second amplify transistor 826 receives the output of the inverting amplifier through the amplify node 824, and the local select transistor 827 is selected by the local select signal 827A. And the second amplifier is connected to the global bit line 831, where the node numbers are the same as those of FIG. 8A to 8C for ease of understanding.

With the local sense amp, configuring memory is more flexible, such that multiple memory macros can be easily configured with small segmented memory array with local sense amps. And number of sense amps can be determined by the target speed, for example, high speed application needs more segmented array with more sense amps, while high density application needs more memory cells with reduced number of sense amps.

Figure 9A:
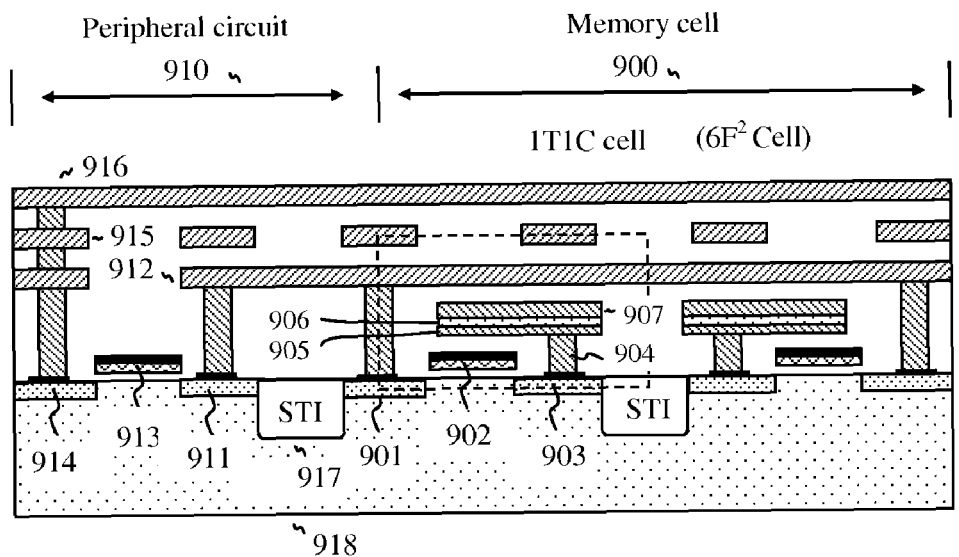
FIG. 9A illustrates an example cross sectional view of the 1T1C memory cell for implementing the nonvolatile FRAM or volatile DRAM.

In FIG. 9A, an example cross sectional view of the memory cell (shown in FIG. 2A) is illustrated, wherein memory cell 900 is composed of the pass transistor having a drain 901, a gate 902 and a source 903, and the capacitor having bottom plate 905 and top plate 907 on ferroelectric material 906, such as, PZT (lead zirconate titanate). And the capacitor is connected to the source 903 of the gate 902 through a contact region 904. And the local bit line 912 is connected to the drain 901 of the pass gate 902, where the local bit line 912 is composed of metal-1 layer. And the local bit line 912 is connected to the write transistor 913 through a drain region 911 as an example connection, where the write transistor 913 is connected to the global bit line 916 through a source region 914 and metal layers including metal-1 and metal-2 region 915. And the global bit line 916 is composed of metal-3 layer. The peripheral circuit region 910 is placed on the same surface of a substrate 918, where the memory cell region 900 is isolated by STI (Shallow Trench Isolation) region 917. And various ferroelectric capacitors can be used as the storage capacitor, such as lead zirconate titanate (PZT), lead lanthanum zirconium titanate (PLZT), barium strontium titanate (BST), and strontium bismuth tantalate (SBT).

Figure 9B:
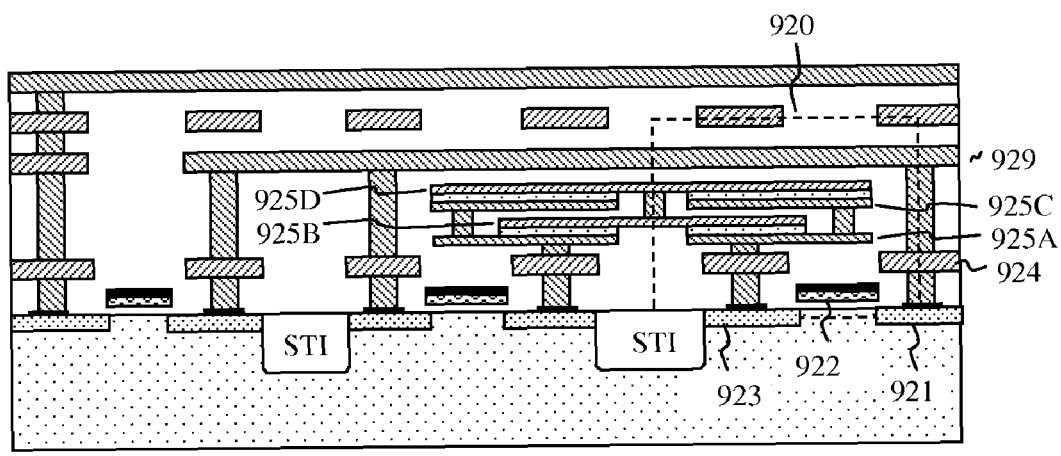
FIGS. 9B and 9C illustrate alternative cross sectional views.

In FIG. 9B, an alternative memory cell structure for increasing capacitance value with fingered shape capacitor is illustrated, wherein the memory cell 920 is composed of the pass transistor including gate 922, drain/source 921 and 923, and the capacitor including fingered shape plates 925A, 925B, 925C and 925D. The plates 925A and 925B configure a first capacitor, and the plates 925C and 925D configure a second capacitor. In particular, the two fingered capacitors are formed in between a first routing layer 924 and a second routing layer 929 serving as the local bit line, which increases capacitance value in a given area. And for forming the ferroelectric capacitor on the metal-1 line 924, ferroelectric materials can be deposited at low temperature as a prior art, "Low-Temperature Capacitor-Over-Interconnect (COI) Modular FeRAM for SOC Application", IEEE Transaction on Electron Devices, Vol. 51, No. 6, June 2004.

Figure 9C:
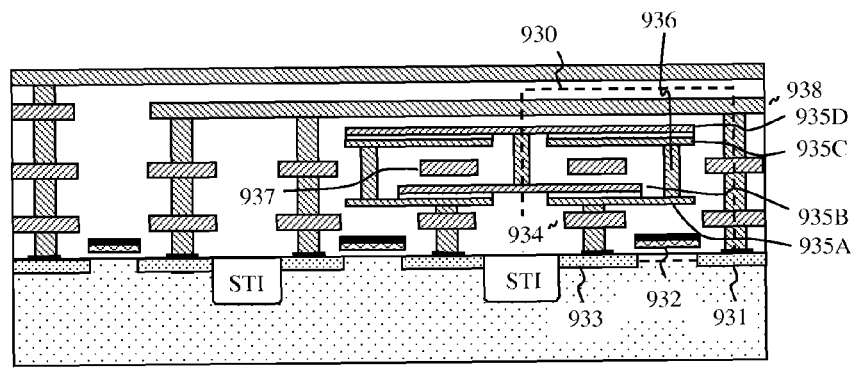

In FIG. 9C, an alternative memory cell structure including separated capacitors is illustrated, wherein the memory cell 930 is composed of the pass transistor including gate 932, drain/source 931 and 933, and the capacitor including fingered shape plates 935A, 935B, 935C and 935D. In particular, a routing layer 937 serving a main word line is passing between the bottom capacitor and the top capacitor, such that the bottom capacitor is composed of plates 935A and 935B, and the top capacitor is composed of plates 935C and 935D. Hence, contact depth between each metal layer is reduced for connecting the capacitor to the source region 933 through a metal-1 region 934. Alternatively, the ferroelectric capacitor can be used as a volatile memory as explained above in FIG. 3A. And, the regular capacitor can be used as the volatile memory, such that various dielectric materials can be used for forming the regular capacitor, such as silicon dioxide, silicon nitride, Ta2O5, TiO2, Al2O3, TiN/HfO2/TiN(TIT), and Ru/Insulator/TiN(RIT).

Figure 9D:
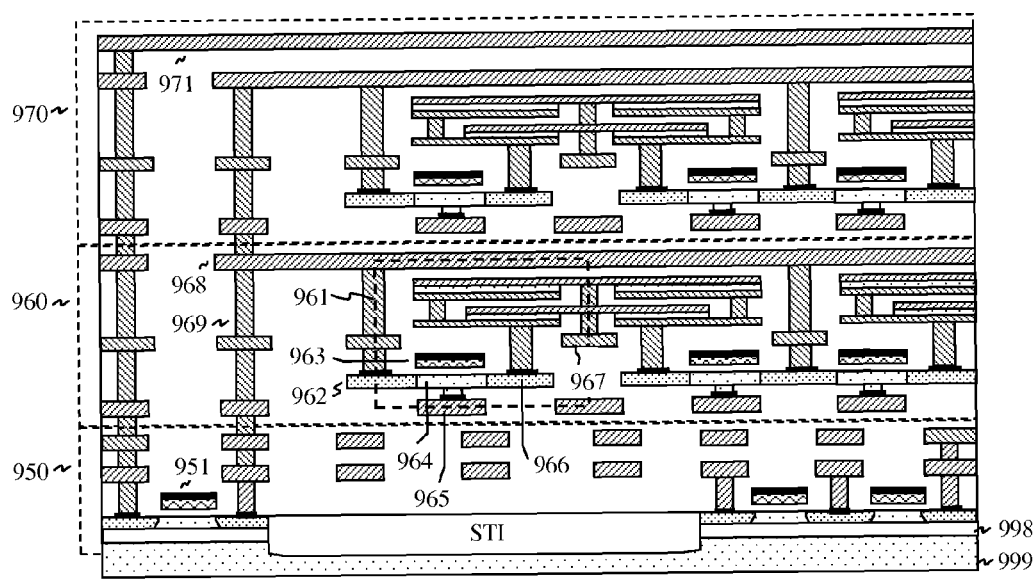
FIG. 9D illustrates a stacked configuration with thin film transistor, according to the teachings of the present invention.

In FIG. 9D, stacked memory cell structure is illustrated as an example, wherein memory cells in a second floor 960 are formed on the control circuits 950 in a first floor, and memory cells in a third floor 970 are formed on the second floor. The memory cells are connected to local bit line including metal region 968 and contact region 969, and the local bit line is connected to a write transistor 951, for example. And the write transistor 951 is connected to the global bit line. The plate line 967 is connected to the capacitor. The memory cell 961 is composed of the pass transistor 963 including drain/source regions 962 and 966, and a body region 964. In particular, the body region 964 is connected to a metal bias line 965 from the bottom. As shown in the figure, the memory cells include thin film transistor as the pass transistor with body-tied structure for biasing the body, so that the bias voltage is provided in order to reduce sub-threshold leakage current for NMOS pass transistor. And the memory cells have same characteristics as long as same material and thickness are used. And the transistors in the first floor are formed on SOI (Silicon on Insulator) wafer as an alternative configuration, wherein the BOX (Buried Oxide) layer 998 is formed on the substrate 999. Furthermore, thin film layer is formed from silicon, silicon-germanium and germanium.

Figure 10A:
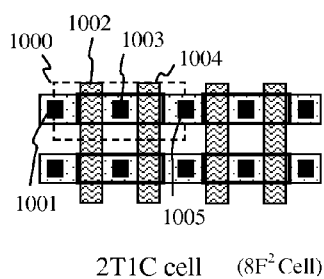
FIG. 10A illustrates an example top view of the 2T1C memory cell.

In FIG. 10A, an example top view of the 2T1C memory cell (shown 410 in FIG. 4A) is illustrated, wherein a broken line 1000 shows the 2T1C memory cell, poly gate 1002 serves as the pass transistor, and poly gate 1004 serves as the pre-charge transistor. Contact region 1001 is connected to the local bit line, another contact region 1003 is connected to the storage node, and contact region 1005 is connected to half VDD voltage. The 2T1C memory cell occupies 8F.sup.2, so that area is slightly increased, but operation speed is dramatically reduced with fixed plate line.

Figure 10B:
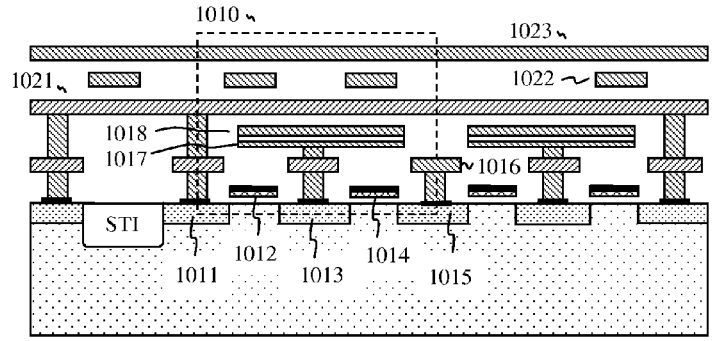
FIG. 10B illustrates a cross sectional view of a planar configuration.

In FIG. 10B, the cross sectional view of the 2T1C memory cell is illustrated, wherein memory cell 1010 is composed of the pass transistor having a drain 1011, a gate 1012 and a source 1013, the capacitor having bottom plate 1017 and top plate 1018, and the pre-charge transistor having a drain 1013 (source of the pass transistor as well), a gate 1014 serving as the pre-charge transistor, and a source 1015. And the capacitor is connected to the source 1013 of the pass gate 1012 through contact region and metal-1 region. The source of the pre-charge transistor 1014 is connected to the metal-1 region 1016 (forcing half VDD voltage). And the local bit line 1021 is connected to the drain 1011 of the pass gate 1012 through the metal-1 and metal-2 region, where the local bit line 1021 is composed of metal-2 layer. And the global bit line 1023 is composed of metal-4 layer while a main word line is composed of metal-3 layer.

Figure 10C:
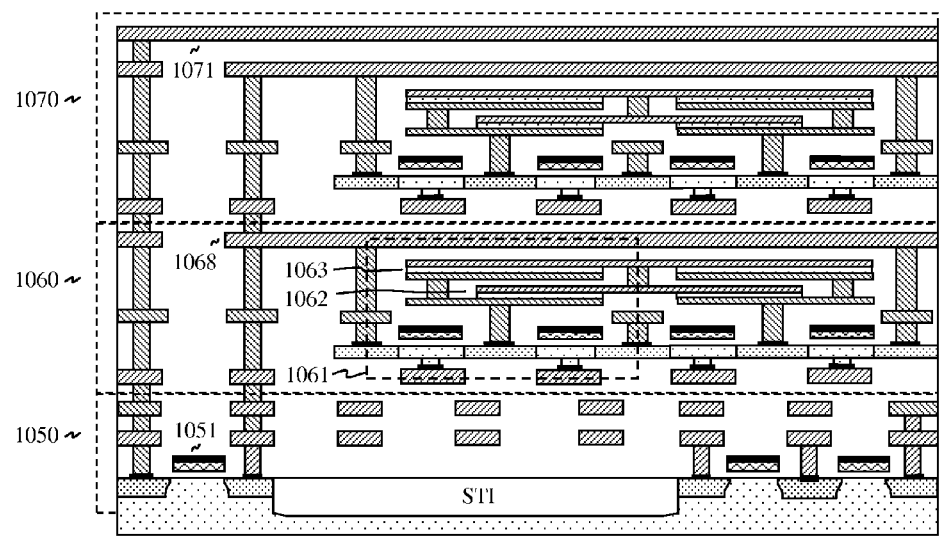
FIG. 10C illustrates a stacked configuration with thin film transistor for the 2T1C memory cell, according to the teachings of the present invention.

In FIG. 10C, stacked memory cell structure for the 2T1C memory cell is illustrated as an example, wherein memory cell 1061 in the second floor 1060 is formed on the control circuits 1050 in the first floor, and memory cells in the third floor 1070 are formed on the second floor, such that the pass transistors of the memory cell is composed of thin film transistor including LTPS (low temperature polycrystalline silicon) layer. Two ferroelectric capacitors 1062 and 1063 are included in the memory cell 1061. The memory cells are connected to the local bit line including metal region 1068, and the local bit line is connected to a write transistor 1051, for example. And the write transistor 1051 is connected to the global bit line 1071. As shown in the figure, the memory cells include thin film transistor as a pass transistor with body-tied structure for biasing the body, so that self-heating problem is alleviated by forcing a bias voltage to the body of the thin film transistor.

In FIG. 11A, an example top view of the series memory cells (shown 451 in FIG. 4D) is illustrated, wherein the series memory cell 1100 includes a string select transistor 1102, and four series memory cells including a memory cell 1110 which is selected by a word line 1111. The series memory cell occupies 4F.sup.2, so that area is dramatically reduced.

Figure 11B:
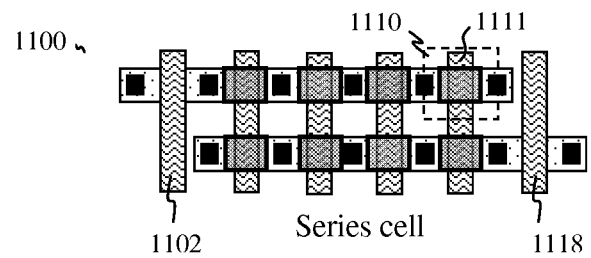
FIG. 11B illustrates a cross sectional view of a planar configuration.
Figure 11B:
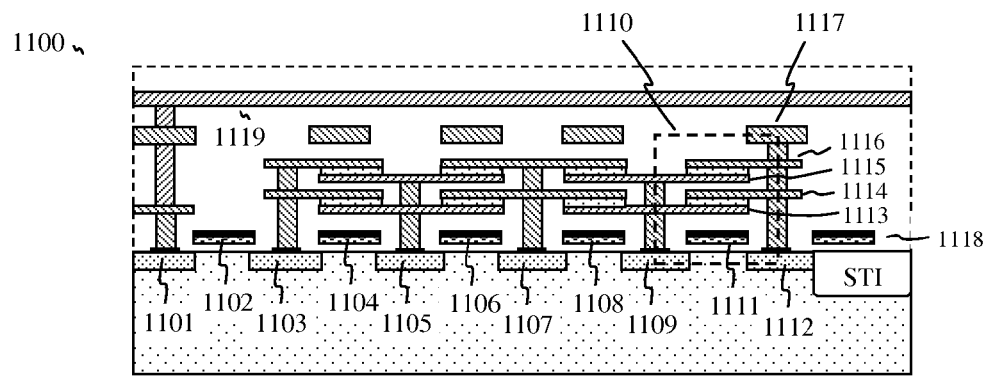

The related cross sectional view is illustrated in FIG. 11B, wherein the series memory cell 1100 is composed of the string select transistor 1102 having a drain 1101 and a source 1103, a first memory cell having a drain 1103 (the source of the string select transistor), a gate 1104 and a source 1105, a second memory cell having a drain 1105 (the source of the gate 1104), a gate 1106 and a source 1107, a third memory cell having a drain 1107 (the source of the gate 1106), a gate 1108 and a source 1109, a fourth memory cell 1110 having a drain 1109 (the source of the gate 1108), a gate 1111 and a source 1112. The source 1112 of the fourth memory cell is connected to metal-2 layer 1117 which is forced to half VDD voltage. The memory cell 1110 is composed of the gate 1111 and the capacitor including multiple plates which forms fingered shape, wherein the plates 1113 and 1114 are connected to the pass transistor, and the plates 1115 and 1116 are connected to the plate line 1117. And the (metal-3) local bit line 1119 is connected to the drain 1101 of the string select transistor 1102. The passing gate 1118 is used for selecting the next memory string (as shown in FIG. 11A).

Figure 11C:
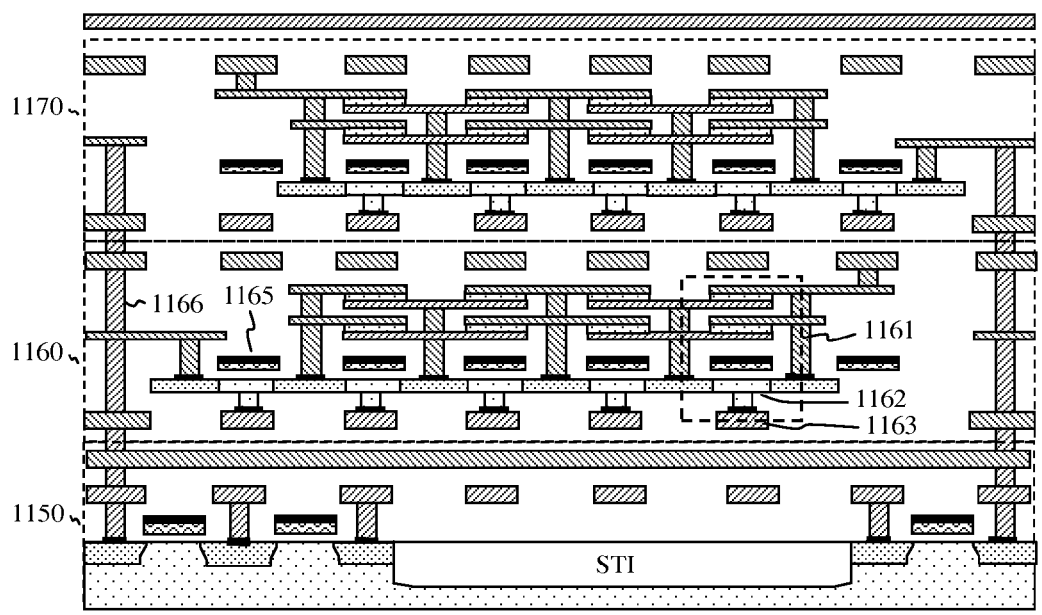
FIG. 11C illustrates a stacked configuration with thin film transistor for the series memory cells, according to the teachings of the present invention.

In FIG. 11C, stacked memory cell structure for the series memory cells is illustrated as an example, wherein memory cell 1161 in the second floor 1160 is formed on the control circuits 1150, and memory cells in third floor 1170 are formed on the second floor, wherein the memory cell 1161 is composed of same structure as the memory cell 1110 in FIG. 11B, except thin film pass transistor serving as the pass transistor. The thin film transistor configures a body-tied structure for biasing the body, so that self-heating problem is alleviated by forcing a bias voltage to the body 1162 through bias line 1163. The ferroelectric capacitor is formed at low temperature as explained above. And the local bit line 1166 connected to the series memory cells through the string select transistor 1165.

While the descriptions here have been given for configuring the memory circuit and structure, alternative embodiments would work equally well with PMOS pass transistor, such that the PMOS transistor can be used for configuring the memory cell, and signal polarities are reversed to control the PMOS pass transistor configuration.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
  a memory cell including a pass transistor and a ferroelectric capacitor based on a ferroelectric material, wherein the ferroelectric capacitor is composed of a first plate connecting to the pass transistor and a second plate connecting to a plate line; and
  a non-inverting local sense amp including a first inverting amplifier and a second inverting amplifier, wherein the first inverting amplifier includes an inverter having a first amplify transistor and a pull-up transistor for reading the memory cell through a local bit line when reading, a local pre-charge transistor for pre-charging the local bit line, and a write transistor for driving the local bit line when writing; and the second inverting amplifier includes a second amplify transistor for reading an amplify node connecting to an output node of the inverter, and a local enable transistor is serially connected to the second amplify transistor for enabling, where the local enable transistor is connected to a global bit line; and
  a global sense amp for reading an output from the non-inverting local sense amp through the global bit line, wherein the global sense amp includes a global reset transistor for resetting the global bit line, a cross coupled inverter latch for storing an output from a bit read circuit connecting to the global bit line and for sending a write data to a bit write circuit driving the global bit line, a data transfer circuit for transferring a read output from the cross coupled inverter latch to a forwarding read line through a read selector and a read buffer, and a data receive circuit for sending a write input to the cross coupled inverter latch from a forwarding write line through a receive switch; and a locking signal generator for locking the bit read circuit with a locking signal which is generated by a delay circuit receiving the read output from the cross coupled inverter latch.

2. The memory device of claim 1, wherein the local bit line connecting to the non-inverting local sense amp is pre-charged to a pre-determined voltage, and a source line of the first amplify transistor of the inverter is connected to a bias voltage for adjusting trip point of the inverter.

3. The memory device of claim 1, wherein the first amplify transistor of the inverter includes low threshold MOS transistor.

4. The memory device of claim 1, wherein the first amplify transistor and the second amplify transistor of the non-inverting local sense amp are composed of longer channel length transistor than that of the local pre-charge transistor.

5. The memory device of claim 1, wherein the global sense amp comprises the global reset transistor having a reset transistor, the bit write circuit having an inverting buffer and a transmission gate, the bit read circuit having a read transistor and a read enable transistor, the cross coupled inverter latch having two inverters, a latch reset transistor and a transmission gate, the data receive circuit having a receive control circuit and a receive switch, and the data transfer circuit having a read selector, a bypass tri-state inverter, a common reset transistor and a read inverter, and a returning buffer having an inverter.

6. The memory device of claim 1, wherein the global sense amp comprises the global reset transistor having a reset transistor, the bit write circuit having an inverting buffer and a transmission gate, the bit read circuit having a read transistor and a read enable transistor, the cross coupled inverter latch having two inverters, a latch reset transistor and a transmission gate, the data receive circuit having a receive gate, a receive inverter and a receive tri-state inverter, the data transfer circuit having a read selector, a bypass tri-state inverter, a common reset transistor and a read inverter, and a returning buffer having an inverter.

7. The memory device of claim 1, wherein the plate line of the memory cell is connected to a constant voltage source, such as, a ground voltage and a supply voltage, for configuring a volatile memory.

8. The memory device of claim 1, wherein the plate line of the memory cell is connected to near half of a supply voltage for configuring a non-volatile memory.

9. The memory device of claim 1, wherein the memory cell is composed of a select transistor connecting to a storage node, a ferroelectric capacitor connecting to the storage node, and a pre-charge transistor connecting to the storage node for configuring 2T1C memory cell.

10. The memory device of claim 1, wherein the memory cell configures a series connection for increasing density, such that the series connection is composed of a first memory cell having a first access transistor and a first ferroelectric capacitor, a second memory cell having a second access transistor and a second ferroelectric capacitor, a third memory cell having a third access transistor and a third ferroelectric capacitor, and a fourth memory cell having a fourth access transistor and a fourth ferroelectric capacitor; and the series connection is connected to the local bit line through a string select transistor; and alternatively, more memory cells are serially connected to the series connection for increasing density further.

11. The memory device of claim 1, wherein the non-inverting local sense amp includes a differential amplifier for reading the memory cell through the local bit line, and a reference memory cell is connected to the differential amplifier through a reference local bit line.

12. The memory device of claim 1, wherein the locking signal generator includes a tunable delay circuit which receives an output from the cross coupled inverter latch, where tuning information for the tunable delay circuit is stored in a nonvolatile memory.

13. The memory device of claim 1, wherein the pass transistor of the memory cell is formed from single crystalline silicon or poly crystalline silicon.

14. The memory device of claim 1, wherein the pass transistor of the memory cell is formed from silicon-germanium or germanium.

15. The memory device of claim 1, wherein the ferroelectric capacitor of the memory cell is composed of a fingered shape capacitor.

16. The memory device of claim 1, wherein the ferroelectric capacitor of the memory cell is composed of two capacitors, such that a first capacitor is formed in between a first routing layer and a second routing layer, and a second capacitor is formed in between the second routing layer and a third routing layer.

17. The memory device of claim 1, wherein the ferroelectric capacitor of the memory cell is composed of various ferroelectric materials for configuring non-volatile memory, such as lead zirconate titanate (PZT), lead lanthanum zirconium titanate (PLZT), barium strontium titanate (BST), and strontium bismuth tantalate (SBT).

18. The memory device of claim 1, wherein the memory cell includes a pass transistor and a capacitor based on a dielectric material for configuring volatile memory as an alternative configuration, and the capacitor is formed from various dielectric materials, such as silicon dioxide, silicon nitride, Ta2O5, TiO2, Al2O3, TiN/HfO2/TiN(TIT), and Ru/Insulator/TiN(RIT).

19. The memory device of claim 1, wherein the memory cell is stacked over peripheral circuits.

20. The memory device of claim 1, wherein the memory cell is stacked over another memory cell.

* * * * *